(12) United States Patent
Kondou et al.

(10) Patent No.: US 6,185,481 B1
(45) Date of Patent: Feb. 6, 2001

(54) AIR COOLED ELECTRONIC EQUIPMENT APPARATUS

(75) Inventors: Yoshihiro Kondou; Tadakatsu Nakajima, both of Ibaraki-ken; Shigeo Ohashi, Tsuchiura; Susumu Iwai, Hadano; Masayoshi Miyazaki, Hadano; Shoohei Fuse, Hadano; Kazuo Morita, Hadano; Hidetada Fukunaka, Hadano, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 08/969,361

(22) Filed: Nov. 28, 1997

(30) Foreign Application Priority Data

Nov. 29, 1996 (JP) .................................... 8-319271

(51) Int. Cl.[7] ......................... G05B 13/00; G05B 15/00; G05B 21/00
(52) U.S. Cl. ......................... 700/275; 700/79; 165/233; 165/231
(58) Field of Search ................. 364/528.1, 184; 714/6; 700/275, 79; 165/233, 231

(56) References Cited

U.S. PATENT DOCUMENTS 5,361,188 * 11/1994 Kondou et al. ..................... 361/695
5,418,938 * 5/1995 Hatanaka et al. ..................... 395/575
5,484,262 * 1/1996 Thomas et al. ..................... 415/178
5,592,363 * 1/1997 Atarashi et al. ..................... 361/689
5,678,410 * 10/1997 Fujita et al. ..................... 62/7
5,796,580 * 8/1998 Komatsu et al. ..................... 361/687

FOREIGN PATENT DOCUMENTS 62-49700 * 3/1987 (JP) .
63-164294 * 10/1988 (JP) .
1-28896 * 1/1989 (JP) .

OTHER PUBLICATIONS

Japanese Patent Unexamined Publication No. 62–49700.
Japanese Patent Unexamined Publication No. 1–28896.
Japanese Utility Model Unexamined Publication No. 63–164294.

* cited by examiner

Primary Examiner—William Grant
Assistant Examiner—Victoria Robinson
(74) Attorney, Agent, or Firm—Antonelli, Terry, Stout & Kraus, LLP

(57) ABSTRACT

A semiconductor device provided with a first cooling fan and heat-radiating fins is mounted on a board, and there is provided a second cooling fan for supplying cooling air to the board, such that a flow passage is formed for directing the cooling air, supplied from the second cooling fan, toward the board through the first cooling fan.

14 Claims, 19 Drawing Sheets

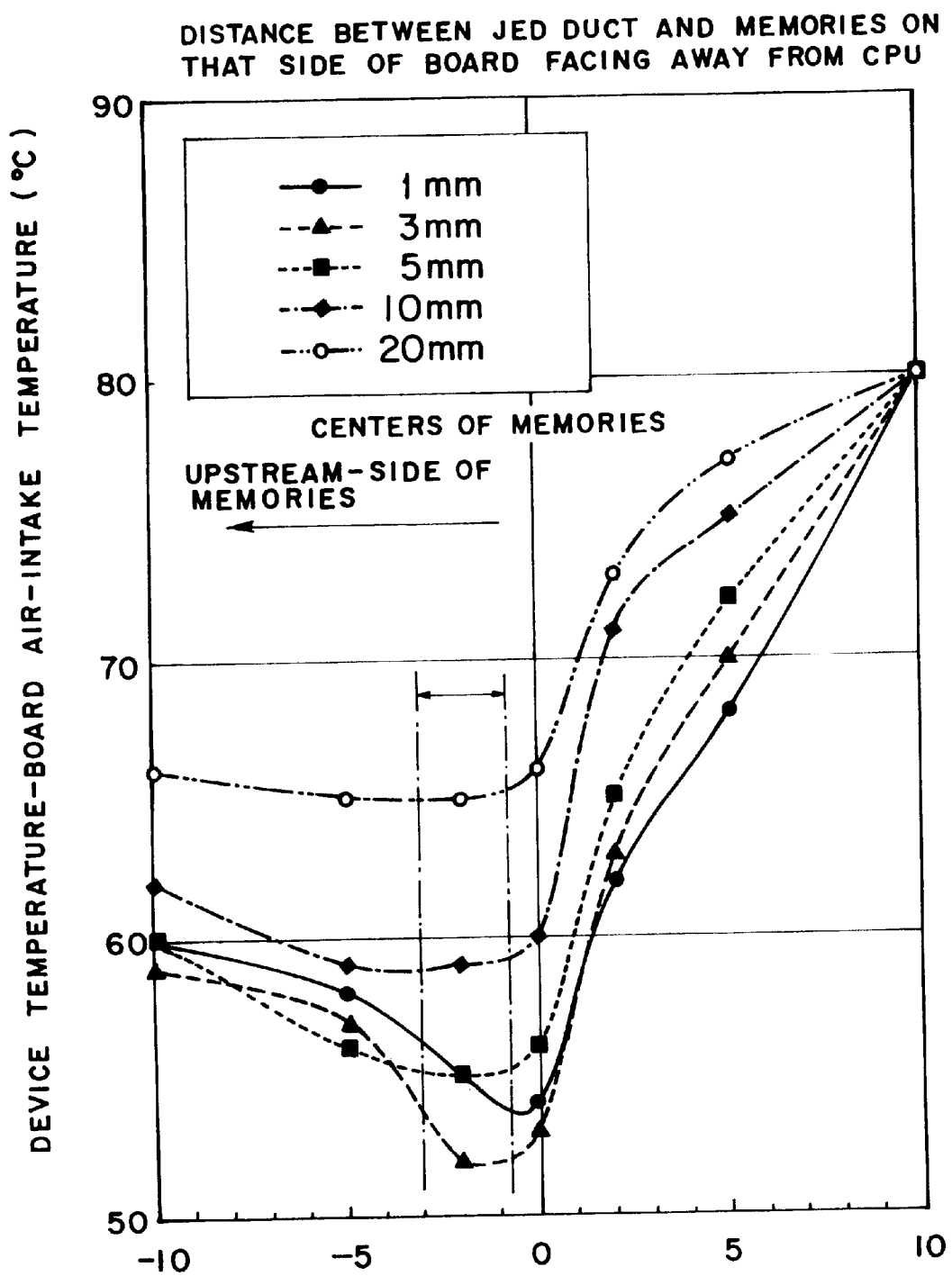

AIR COOLED ELECTRONIC EQUIPMENT APPARATUS

BACKGROUND OF THE INVENTION

This invention relates to a cooling device in an electronic equipment, and more particularly to a system which is constituted by a cooling structure and an reliability of the electronic equipment.

Recently, the processing speed of electronic equipments has become much higher, and the amount of heat, generated from semiconductors, has much increased. Generally, in an air-cooled electronic equipment apparatus such as a computer, a cooling structure (hereinafter referred to as "fan-incorporating heatsink"), in which fins and a fan are combined together in a unitary manner, is mounted on an LSI package which is a high heat-generating semiconductor device, and the semiconductor, which generates a large amount of heat, is cooled in a concentrated manner by such heatsink. For a board on which IC chips, such as a memory chip, (which are relatively low heat-generating semiconductor devices), and the above LSI package are mounted in a mixed manner, it is customary to simultaneously cool the IC chips and the LSI package.

For example, there has been proposed a cooling method using a fan-incorporating heatsink (as disclosed in Japanese Patent Unexamined Publication No. 62-49700), in which a heatsink of the fan-incorporating heatsink is mounted, taking the rotation of a fan into consideration, thereby enhancing the cooling performance of the heatsink.

Japanese Patent Unexamined Publication No. 1-28896 discloses a prior art technique of simultaneously cooling semiconductors which are mounted on the same board, and generate different amounts of heat, and more specifically, this publication discloses a technique in which there is provided a duct having a fan for supplying cooling air (cooling wind) to the high heat-generating semiconductor, and there is provided a fan for supplying cooling air to other low heat-generating semiconductors and the high heat-generating semiconductor.

Another prior art technique of cooling an electronic equipment is disclosed in Japanese Utility Model Unexamined Publication No. 63-164294. In this prior art technique, the orientation of a heatsink is so determined that if a cooling fan of the fan-incorporating heatsink is subjected to failure, a natural convection can be easily produced.

In the fan-incorporating heatsink disclosed in Japanese Patent Unexamined Publication No. 62-49700, when the amount of generation of heat from a semiconductor becomes large, the heatsink itself is heated to a high temperature, so that the temperature of the cooling fan connected to the heatsink also becomes high. The lifetime of the cooling fan is proportional to the lifetime of a bearing constituting a rotating portion thereof, and therefore the lifetime of the cooling fan of the fan-incorporating heatsink is extremely shortened as compared with the case where the cooling fan is provided in spaced relation to the semiconductor device as in the prior art techniques disclosed in Japanese Patent Unexamined Publication No. 1-28896 and Japanese Utility Model Unexamined Publication No. 63-164294.

Therefore, there is an extremely high possibility that the cooling fan of the fan-incorporating heatsink is stopped (that is, fails to operate). However, in the above prior technique disclosed in Japanese Patent Unexamined Publication No. 62-49700, no consideration is given to the failure of the cooling fan, and if this occurs, the cooling air can not be secured, and the temperature of the semiconductor abruptly rises beyond an operable limit to lead to destruction of the semiconductor. This problem has not been taken into consideration. Further, it has not been taken into account that the cooling air discharged from the fins of the fan-incorporating heatsink is again sucked into the cooling fan of the fan-incorporating heatsink for returning of the high temperature exhaust.

The conventional construction, disclosed in Japanese Patent Unexamined Publication No. 1-28896, is provided with the plurality of fans, but when any of these fans is stopped, sufficient cooling air can not be secured as in the prior art technique disclosed in Japanese Patent Unexamined Publication No. 62-49700, and this problem has not been taken into consideration. Particularly, the cooling air supplied from the fan in order to cool the low heat-generating devices and the high heat-generating device in common is caused to flow parallel to the board having these heat-generating devices mounted thereon, and therefore when the cooling fan for cooling the high heat-generating semiconductor device is stopped, the duct provided for each high heat-generating semiconductor forms a barrier to the flow of the cooling air, so that the cooling air can not be sufficiently supplied to the downstream-side low heat-generating semiconductors, as a result, the temperature of the downstream-side IC chips extremely rises. This problem has not been taken into consideration.

In the prior art technique disclosed in Japanese Utility Model Unexamined Publication No. 63-164294. although the failure of the fan is taken into consideration, heat radiation is effected by a natural convection. Recently, semiconductor devices are mounted close to one another, that is, at a high density, and in this case, high-temperature air becomes stagnant, which has not been taken into consideration. When the amount of heat generated from the semiconductor devices increases, additional cooling means, such as a separate discharge fan, must be provided, but this has not been taken into consideration.

In the above prior art techniques, when the fan is stopped, the temperature of the semiconductor abruptly rises, and therefore in order to prevent the semiconductor device from being destroyed, the supply of electric power thereto is immediately stopped, thereby stopping the generation of heat from the semiconductor device. However, if the supply of the electric power is stopped without taking into consideration data stored in the semiconductor device, there is a possibility that not only data prepared by the user of the air-cooled electronic equipment apparatus but also basic data and software indispensable to the operation of the air-cooled electronic equipment apparatus are destroyed. Therefore, it is necessary to allow a sufficient time for protecting the above necessary data before the supply of the electric power is stopped when the temperature of the semiconductor rises to its operating limit. However, this has not been taken into consideration.

As described above, in the above prior art techniques including one in which the semiconductors generating different amounts of heat are mounted on the same board, no consideration has been given to the problem that the supply of the cooling air to the high heat-generating device becomes insufficient when the fan of the fan-incorporating heatsink is stopped.

Besides, no consideration has been given to the need for performing processings to protect the necessary data and software so as to secure the redundancy of the apparatus before the supply of the electric power to the semiconductor device is stopped in association with stoppage of the fan.

Namely, no consideration has been given to the type of cooling structure suitable for protecting such data and also to the construction of a system necessary for protecting the data.

SUMMARY OF THE INVENTION

The present invention has been made in order to overcome the above problems, and a first object of the invention is to provide an air-cooled electronic equipment apparatus in which the redundancy of cooling means for a plurality of semiconductor devices generating different amount of heat is enhanced, thereby improving the reliability of the apparatus. More specifically, the object is to provide an air-cooled electronic equipment apparatus having a semiconductor-cooling structure by which even when an air-cooling fan for cooling a semiconductor device is stopped, the air can be caused to flow in a sufficient amount to maintain the temperature of the semiconductor device within the temperature range in which the semiconductor can be operated.

A second object of the invention is to provide an air-cooled electronic equipment apparatus in which even if the cooling of the above semiconductor fails, necessary data can be protected, thereby improving the reliability of the apparatus. A further object of the invention is to provide an air-cooled electronic equipment apparatus which is provided with a semiconductor-cooling structure suitable for effecting processings of the necessary data and a processing system, thereby improving the reliability of the apparatus. More specifically, the object is to provide an air-cooled electronic equipment apparatus in which when the air-cooling fan for cooling the semiconductor device is stopped, this semiconductor stores necessary ones of the data in the process of being processed in its memory, and thereafter the operation of the semiconductor, corresponding to the memory is stopped.

In order to achieve the first object, according to the present invention, there is provided an air-cooled electronic equipment apparatus comprising a semiconductor device which is mounted on a board and is a heat-generating device; a first cooling fan mounted on the semiconductor device so as to blow the air toward the semiconductor device and the board; a second cooling fan for supplying cooling air to the board; and a flow passage for directing the cooling air, supplied from the second cooling fan, toward the board through the first cooling fan. According to a modified form of the invention, there is provided an air-cooled electronic equipment apparatus comprising a plurality of semiconductor devices mounted on a board, each of the semiconductor devices being a heat-generating device; heat-radiating fin members mounted respectively on the semiconductor devices; first cooling fans mounted respectively on the fin members so as to blow the air toward the semiconductor devices and the board; a second cooling fan for supplying cooling air to the board; and a flow passage for directing the cooling air, supplied from the second cooling fan, toward the board.

In a preferred form of the invention, partition means is provided for the first cooling fan, and serves to divide the cooling air flow passage into a first flow passage extending from the second cooling fan to the first cooling fan, and a second flow passage extending from the first cooling fan to an end portion of the board. The partition means partitioning the cooling air flow passage may be a duct which prevents an air stream, blown from the first cooling fan, from flowing into an inlet of the first cooling fan.

In a preferred form of the invention, a cooling air flow passage is provided so as to direct the cooling air, supplied from the second cooling fan, toward that side of the board facing away from the first cooling fan. The second cooling fan can be provided downstream of the board.

In order to achieve the second object, there is provided an air-cooled electronic equipment apparatus comprising a board; a plurality of main semiconductor devices mounted on the board, each of the main semiconductor devices generating a large amount of heat; auxiliary semiconductor devices each generating a smaller amount of heat than the respective main semiconductor devices do; heat-radiating fin members mounted respectively on the main semiconductor devices; first cooling fans mounted respectively on the fin members so as to blow the air toward the main semiconductor devices and the board; a second cooling fan for supplying cooling air to the board; means for detecting of the number of revolutions of the first and second cooling fans; means for detecting abnormality of the fans in accordance with the detection results of the detecting means; and means for determining an operation of the main semiconductor device in accordance with the detection results of the abnormality detecting means. In a preferred form of the invention, the means for determining the operation of the main semiconductor device may stop the main semiconductor device, corresponding to the fan with respect to which the abnormality has been detected by the abnormality detecting means, after a predetermined time period.

Also, in order to achieve the second object, there is provided an air-cooled electronic equipment apparatus comprising at least one board; a plurality of CPUs mounted on the board, each of the CPUs generating a large amount of heat; memories each generating a smaller amount of heat than the main semiconductor devices do; heat-radiating fin members mounted respectively on the CPUs; first cooling fans mounted respectively on the fin members so as to blow the air toward the CPUs and the board; a second cooling fan for supplying cooling air to the board; means for detecting the number of revolutions of the first and second cooling fans; means for detecting abnormality of the fans in accordance with the detected fan revolution number; means for storing arithmetic data, retained in the CPU, in the memory or an external memory device in accordance with the detection results of the abnormality detecting means; and means for stopping only the operation of the CPU associated with the data, after the storing of the data is finished. In a preferred form of the invention, the memories are connected to the plurality of CPUs, and data can be read and written by the CPU.

In the above construction, the duct is provided on the board having the IC chips and the LSI package mounted thereon, and the second cooling fan separate from the first cooling fan of a fan-incorporating heatsink is provided at one end of the duct so as to feed the cooling air toward the board, and the duct is so designed as to forcibly pass the cooling air through the first cooling fan in the direction of the axis thereof. With this construction, even if the first cooling fan of the fan-incorporating heatsink is stopped, the amount and flow of the cooling air as in the event of the first cooling fan being driven can be secured, and the cooling air is prevented from circulating around the fan-incorporating heatsink, and the cooling performance of the fan-incorporating heatsink as well as the reliability of the air-cooled electronic equipment apparatus having this heatsink mounted thereon is improved.

The first cooling fan extends into the duct, and with this construction a sufficient amount of cooling air can be supplied to the fan-incorporating heatsink, and the cooling performance of the fan-incorporating heatsink can be improved.

A plurality of holes are provided in planes of projection of the IC chips mounted on that side of the board facing away from the fan-incorporating heatsink, and a plurality of holes are provided in that portion of the duct disposed adjacent to the second cooling fan. With this construction fresh cooling air can be supplied to the IC chips through the holes formed in the duct, the temperature distribution between the IC chips can be made uniform, a waste of the cooling air can be eliminated, and the cooling can be effected with a smaller amount of the cooling air, the noises of the computer are reduced, and the size of the computer can be reduced.

The second cooling fan is provided upstream of or downstream of the board, and with this construction even if the first cooling fan of the fan-incorporating heatsink is stopped, the amount and flow of the cooling air as in the event of the first cooling fan being driven can be secured, and the cooling performance of the fan-incorporating heatsink as well as the reliability of the air-cooled electronic equipment apparatus having this heatsink mounted thereon is improved.

A plurality of boards are mounted in a stacked manner, and the duct is provided for each of these boards, and with this construction even if the first cooling fan of the fan-incorporating heatsink is stopped, the amount and flow of the cooling air as in the event of the first cooling fan being driven can be secured, and the cooling performance of the fan-incorporating heatsink as well as the reliability of the air-cooled electronic equipment apparatus having this heatsink mounted thereon is improved.

The duct comprises at least two parts, and one of these parts is provided at that side where the connector for transmitting and receiving signals relative to the board and for supplying electric power is provided, and with this construction the efficiency of attachment and detachment of the board is enhanced, the time required for the attaching and detaching operations can be reduced, and the reliability of the air-cooled electronic equipment apparatus is improved.

BRIEF DESCRIPTION OF THE DRAWINGS

FIG. 18 is a graph showing the relation between the distance (deviation) D between the centers of the memories on that side of the CPU board facing away from the CPU and the centerline (axis) of the memory-cooling jet duct hole d the temperature difference;

DESCRIPTION OF THE PREFERRED EMBODIMENTS

Preferred embodiments of the present invention will not be described in detail with reference to the drawings.

First, a first embodiment of the invention will now be described with reference to FIGS. 1 to 4.

Figure 1:
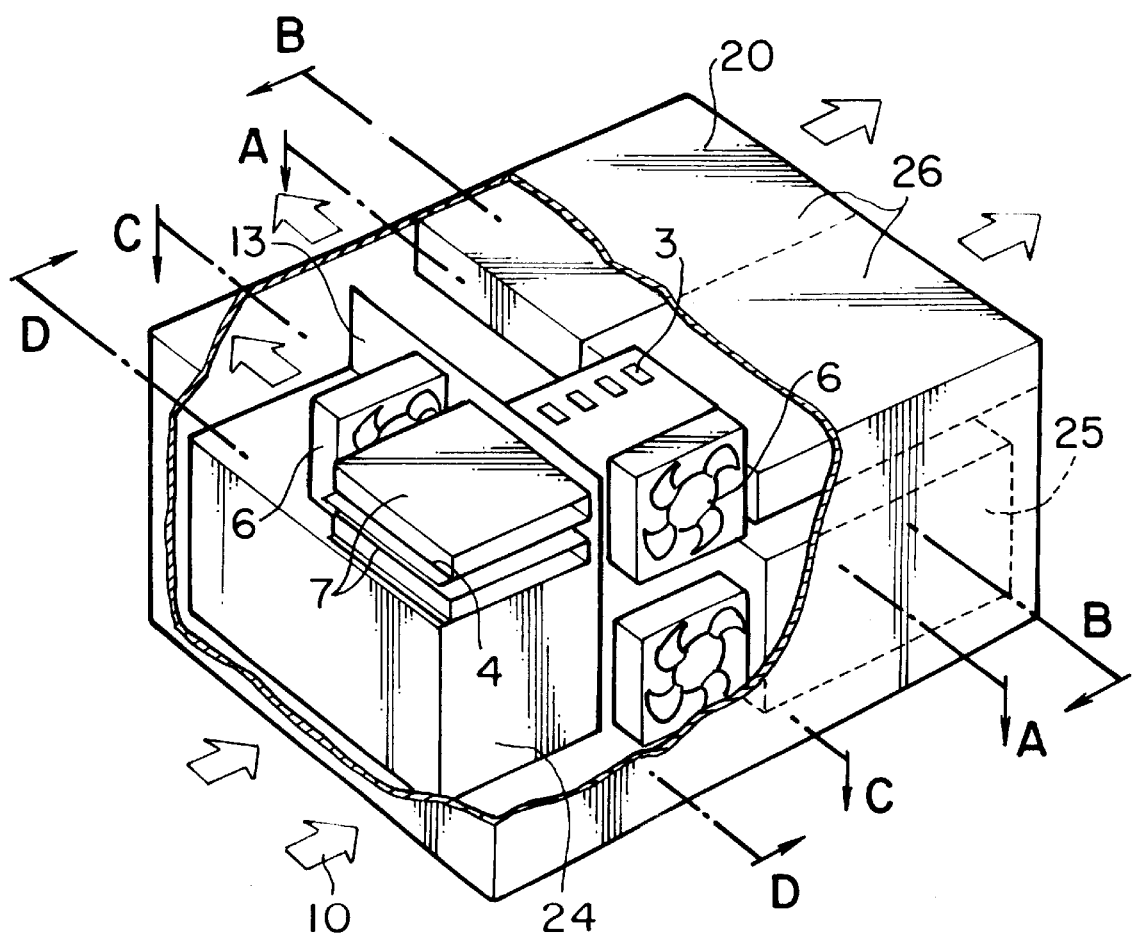
FIG. 1 is a partly-broken, perspective view of a first embodiment of an air-cooled electronic equipment of the present invention.
Figure 2:
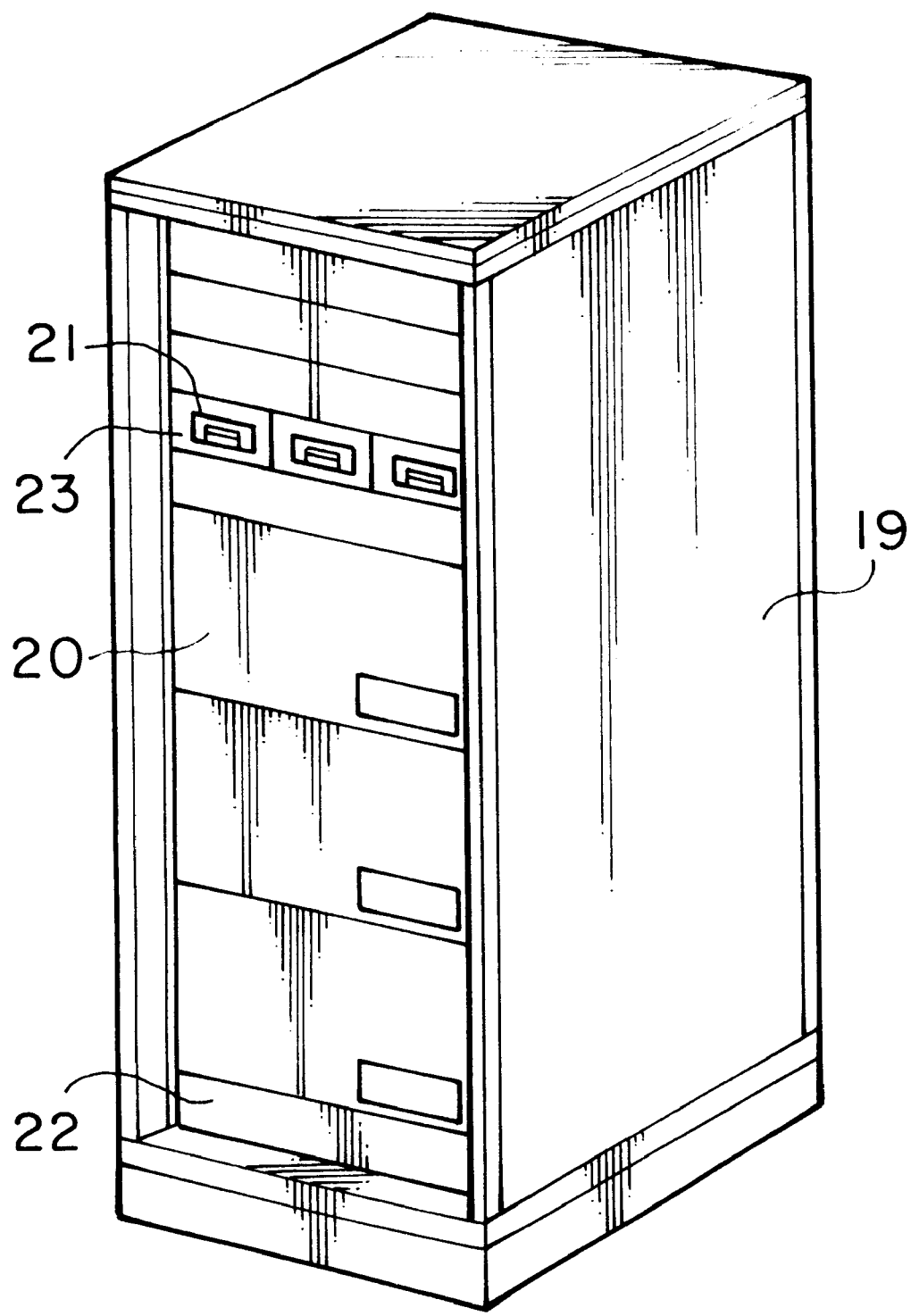
FIG. 2 is a perspective view showing an embodiment in which the present invention is applied to a computer.

FIG. 1 is a partly-broken, perspective view of an air-cooled electronic equipment of the first embodiment. FIG. 2 is a perspective view showing as a whole a computer using the air-cooled electronic equipment apparatus of the invention. FIGS. 3 and 4 are a plan view and a vertical cross-sectional view, respectively, showing a flow passage of cooling air (cooling wind) for heat-generating devices in the air-cooled electronic equipment apparatus of FIG. 1.

In FIG. 1, a CPU box 24 having CPUs (central processing unit), which are the heart of the computer, and are heat-generating devices generating a large amount of heat, mounted therein, AC/DC converters 26 for converting an AC voltage (supply voltage) into a DC voltage, a DC/DC converter 25 for further fractionizing this DC voltage, an IO package (not shown in the drawings) for inputting and outputting data, and a plurality of fans for moving heat generated by these parts to the ambient atmosphere are mounted in a CPU rack 20.

At least boards 4, on which the above CPU (high heat-generating device) is mounted as an LSI package, a memory package (not shown in the drawings) for storing data computed by the CPU, a bus adaptor (not shown), an oscillator (not shown) for controlling the speed of computation of the CPU are mounted on a platter 13 of the CPU box 24. In this embodiment, although two boards 4 are mounted on each side of the platter 13, the invention is not limited to this construction.

At least the LSI package (high heat-generating device) and a plurality of IC chips generating a smaller amount of heat than that of the LSI package are mounted on the board 4, and a fan-incorporating heatsink, in which fins and a first cooling fan are combined together in a unitary manner, is mounted on the LSI package. A duct 7 is provided between the boards 4, and forms a flow passage of cooling air to be supplied to the heat-generating devices on the board. A second cooling fan for cooling the board 4 and the heat-generating devices on the board 4 is provided at an upstream side or a downstream side of the duct 7.

In this embodiment, the cooling air 10 is drawn from that side where the boards 4 are mounted, and flows through the CPU box 24 to be discharged from a left side of the CPU rack 20, and also the thus drawn cooling air 10 flows through the DC/DC converter 25 and the AC/DC converters 26 to be discharged from a rear side.

As shown in FIG. 2, in addition to the CPU racks 20 shown in FIG. 1, a power source rack 22 and an operation rack 21 are mounted in a cabinet 19 of the computer provided with the air-cooled electronic equipment apparatus of the invention. For example, a plurality of external memory (storage) units (e.g. DAT (digital audio tape recorder) 23 are mounted in the operation rack 21.

The flow of the cooling air as well as its operation will now be described with reference to FIGS. 3A and 3B which show the case where one board 4 shown in FIG. 4 is mounted, these Figures showing the flow passage of the cooling air in a plan view and a vertical cross-sectional view.

Figure 3A:
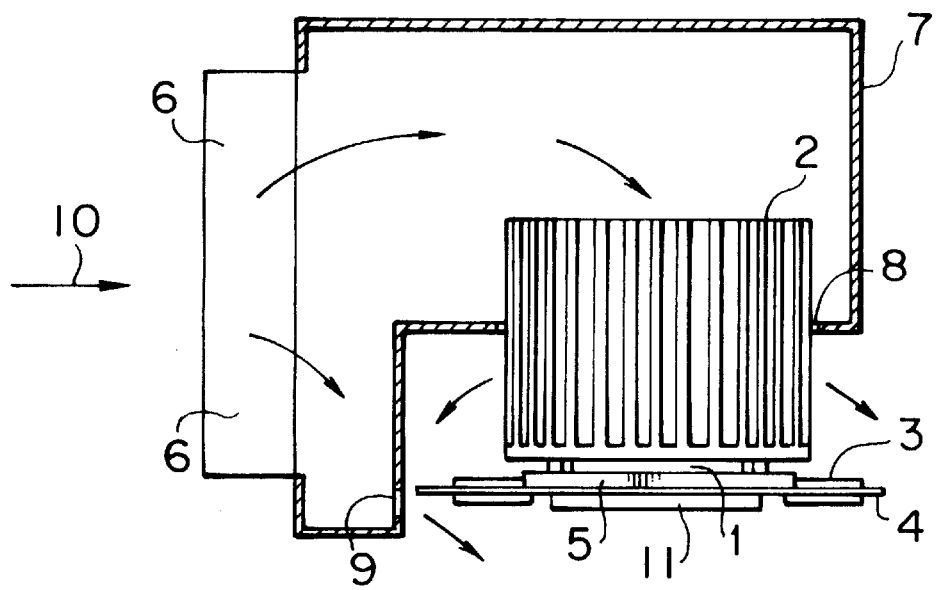
FIG. 3A is a plan view showing a flow passage of cooling air for heat-generating devices in the air-cooled electronic equipment apparatus of FIG. 1.
Figure 3B:
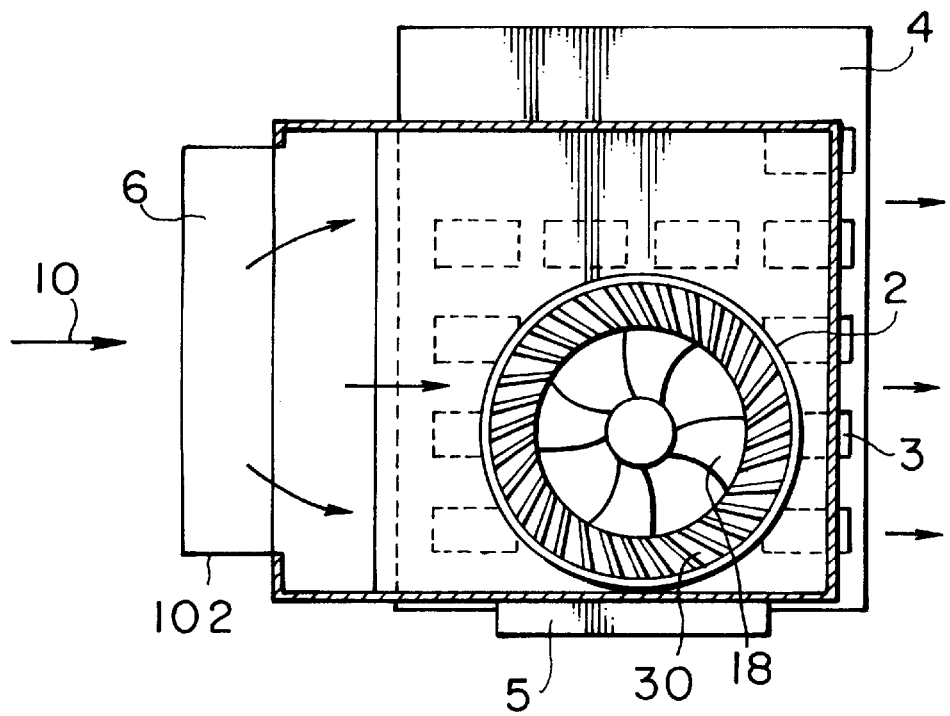
FIG. 3B is a vertical cross-sectional view showing the flow passage of the cooling air for the heat-generating devices in the air-cooled electronic equipment apparatus of FIG. 1.

FIGS. 3A and 3B show a cross-section A—A and a cross-section B—B of FIG. 1, respectively. The LSI package 1, the IC chips 3, and a connector 5 for transmitting and receiving signals and for supplying an electric power are mounted on the board 4. The second cooling fan 6 for cooling the board 4 is provided at one end of the duct 7 to be fixedly secured to this duct 7. A hole 8 having a size larger than an outer size of the fan-incorporating heatsink 2, in which the first cooling fan 18 and the fins 30 are combined together in a unitary manner, is formed in the duct 7, and a part of the fan-incorporating heatsink 2 extends through this hole 8 into the duct 7.

Other hole 9 than the hole 8 for the fan-incorporating heatsink 2 is formed in the duct 7, and this hole 9 is provided for the IC chips 3 mounted on that side or face of the board 4 facing away from the LSI package 1. In the case where the IC chips 3 are not mounted on the board 4 but only the LSI package 1 is mounted on the board 4, the provision of the hole 9 may be omitted since extra cooling air is blown through this hole 9.

The cooling air 10 is drawn through an intake port of the second cooling fan 6 to be directed toward the hole 8, and at this time the pressure within the duct 7 temporarily becomes higher than the ambient atmospheric pressure. Therefore, the cooling air 10 is blown from the hole 8, in which the fan-incorporating heatsink 2 is provided, and the hole 9 for the IC chips 3. The cooling air 10 having flowed into the fan-incorporating heatsink 2 first flows into the first cooling fan 18, incorporated in the fan-incorporating heatsink 2, and then passes the fins 30 of the fan-incorporating heatsink 2 to be applied to the IC chips 3 mounted on that side or face of the board 4 on which the LSI package 1 is mounted. At this time, the cooling air 10 becomes lower in pressure than that in the interior of the duct 7 immediately before it flows into the first cooling fan 18.

In order to enhance the processing performance of the LSI package 1, the IC chips 3 are mounted in surrounding relation to the LSI package 1 to be so arranged as to shorten the time of access between the IC chips 3 and the LSI package 1. In this embodiment, the fins 30 of the fan-incorporating heatsink 2 is ground or cut to provide fin elements which radiate outwardly from the first cooling fan 18 so that the cooling air 10 can flow toward the IC chips 3 by effectively utilizing the wind pressure characteristics of the first cooling fan 18, and with this arrangement the cooling air 10 directed toward the IC chips 3 is accelerated into high velocity, thereby cooling the IC chips 3.

The duct 7 forms the flow passage for the cooling air which is blown from the second fan 6 to enter into the fan-incorporating heatsink 2 toward the board. The cooling air 10 blown from the second cooling fan 6 is transferred through the flow passage, formed by the duct 7, to the first cooling fan without any loss, and therefore the flow rate of the cooling air 10 required to cool the air-cooled electronic equipment apparatus is kept to a minimum.

The duct 7 prevents the cooling air 10, discharged from the fins 30 of the fan-incorporating heatsink 2, from being again drawn into the first cooling fan 18 of the fan-incorporating heatsink 2, and namely the duct 7 prevents the cooling air 10, passed through the heatsink 2 to be increased in temperature, from flowing back to recursively increase the temperature of the LSI package 1. The fins 30 of the fan-incorporating heatsink 2 may be replaced by parallel flat plate-type fins or pin-type fins which have heretofore been used.

The cooling air 10 discharged from the hole 9 for the IC chips 3 impinges on the surfaces of the IC chips 3 mounted on that side of the board 4 facing away from the LSI package 1 at high speed. Therefore, there is achieved a good thermal conduction of these IC chips 3 to the air, and the amount of heat radiated from the devices is made larger as compared with the case where the cooling air is caused to flow parallel to the board 4, so that the temperature of the devices is lowered.

The second fan may be substantially equal in flow rate to the first fan or may have a pressure difference ability. The cooling air can be fed to the CPU 1 without wasting the wind-blowing ability of the two fans, and therefore the cooling efficiency achieved by the first fan and the second fan is further enhanced. In view of a pressure loss of the cooling air flow produced in the course from the second fan to the first fan, the ability of the second fan may be higher than that of the first fan, whereby the wind-blowing ability achieved by the two fans can be made maximum.

When the amount of heat generated from the LSI package 1 becomes large, the temperature of the fins 30 of the fan-incorporating heatsink 2 becomes high, so that the temperature of the first cooling fan 18 connected to the fins 30 also becomes high. The lifetime of the cooling fan is proportional to the lifetime of a bearing constituting a rotating portion thereof, and therefore the lifetime of the first cooling fan 18 of the fan-incorporating heatsink 2 is extremely shorter as compared with the second cooling fan 6. Therefore, there is a high possibility that the first cooling fan 18 of the fan-incorporating heatsink 2 is stopped (that is, fails to operate), and this must be taken into consideration.

In the prior art techniques disclosed in Japanese Patent Unexamined Publication No. 1-28896 and Japanese Utility Model Unexamined Publication No. 63-164294, in which the cooling air is caused to flow parallel to the board 4, when the first cooling fan 30 is stopped, the upstream-side heat-generating devices and the duct of the concentrated cooling means for the heat-generating devices form a barrier to the flow of the cooling air from the common air-cooling fan (second fan), and therefore this cooling air will not be sufficiently supplied to the downstream-side IC chips 3, which results in a problem that the temperature of the downstream-side IC chips 3 rises extremely.

In order to overcome this problem, if the cooling capacity of the second cooling fan 6 is increased, the second cooling fan 6 is formed into a large size, and noises produced by the apparatus increase. Besides, the temperature of the LSI package or the IC chips 3 rises abruptly.

On the other hand, in the present invention, the second cooling fan 6 and the first cooling fan 18 are provided in the flow passage of the cooling air 10 formed by the duct 7 in the direction of flow of the cooling air 10, and therefore even if the first cooling fan 18 of the fan-incorporating heatsink 2 is stopped, the cooling air from the second cooling fan 6 reaches the heatsink through the first cooling fan 18 of the fan-incorporating heatsink 2. Besides, the flow passage formed by the duct 7 is so designed that the above cooling air 10 can be directed toward the board or the heat-generating devices, and as a result the cooling air 10 flows into the fan-incorporating heatsink to be blown against the board 4 through the heatsink.

Namely, even if the first cooling fan 18 of the fan-incorporating heatsink 2 is stopped, the cooling air 10 can be fed toward the board through an upper portion of the fan-incorporating heatsink 2 and an inlet of the first cooling fan 18, so that the LSI package can be cooled. Besides, this cooling air is blown from the heatsink 2, having the spiral fins, to cool the IC chips 3, and therefore the IC chips 3 around the CPU 1 can be cooled. Furthermore, the cooling air 10 is blown off from the periphery of the heatsink 2 generally uniformly with respect to the center of the heatsink 2, and therefore the duct and the high heat-generating devices will not form a barrier which intercepts the cooling air 10 as in the prior art techniques disclosed in Japanese Patent Unexamined Publication No. 1-28896 and Japanese Utility Model Unexamined Publication No. 63-164294, and therefore the IC chips 3 are cooled uniformly.

As described above, the duct 7 is so provided that the flow passage of the cooling air 10 from the second fan 6 is directed toward the board 4 through the first fan 18, and with this construction even if the first cooling fan 18 is stopped, the cooling air 10 can be supplied to the heat-generating devices on the board through the first fan 18, the holes 8 and 9, and therefore the temperature rise of the LSI package 1 and the IC chips can be suppressed.

Therefore, before the temperature (device temperature) of the LSI package 1 rises to an upper limit of an allowable temperature range in which the LSI can operate, there can be provided a sufficient time for data corresponding to the LSI package (whose associated first fan 18 is stopped), such as an OS (operating system), programs used by the user, and data formed by the user, to be stored in or transferred to an external memory device.

Next, description will be made of another embodiment in which unlike the construction of the above first embodiment, a flow passage of cooling air 10 for cooling IC chips 3 mounted on that side of a board 4 facing away from a LSI package 1 is provided. This embodiment of FIGS. 4A and 4B differs from the first embodiment of FIGS. 3A and 3B in that the flow passage for the IC chips 3 mounted on that side of the board 4 facing away from the LSI package 1 is provided.

Similarly to FIGS. 3A and 3B, FIGS. 4A and 4B show a cross-section A—A and a cross-section B—B of FIG. 1, respectively, when a cooling structure is mounted in the electronic equipment shown in FIG. 1. The LSI package 1, the IC chips 3, and a connector 5 for transmitting and receiving signals and for supplying an electric power are mounted on the board 4. A second cooling fan 6 is provided at one end of a duct 7 to be fixedly secured to this duct 7. A hole 8 having a size larger than an outer size of the above fan-incorporating heatsink 2 is formed in the duct 7, and a part of the fan-incorporating heatsink 2 extends through this hole 8 into the duct 7. Further, unlike the case of FIG. 3, the duct 7 is extended to cover the IC chips 3 mounted on that side of the board 4 facing away from the LSI package 1, and other holes 9 than the hole 8 are formed in plane of projections of the IC chips 3.

The IC chips mounted on that surface of the upper board 4 facing away from the LSI package 1 receive heat generated from the LSI mounted on the lower board 4, and therefore the cooling performance for these IC chips 3 on the upper board 4 must be higher than that for the IC chips on the lower board 4.

In this embodiment, the holes 9 for cooling the IC chips 3 on the board 4 disposed above the duct 7 are formed in the planes of projection of the IC chips 3, thereby forming the cooling air flow passages, and with this construction the cooling air 10 impinges on the IC chips 3 mounted on that side of the board 4 facing away from the LSI package 1 at high speed. Therefore, there is achieved a good thermal conduction of these IC chips 3 to the air, so that the temperature of these IC chips is lowered as compared with the case where the cooling air is caused to flow parallel to the board.

In the embodiments shown in FIGS. 3A, 3B, 4A and 4B, although the second cooling fan 6 is disposed upstream of the fan-incorporating heatsink 2, the second cooling fan 6 can be disposed downstream of the fan-incorporating heatsink 2 (see a cross-section C—C and a cross-section D—D in FIG. 1), in which case similar effects can be achieved.

Figure 9:
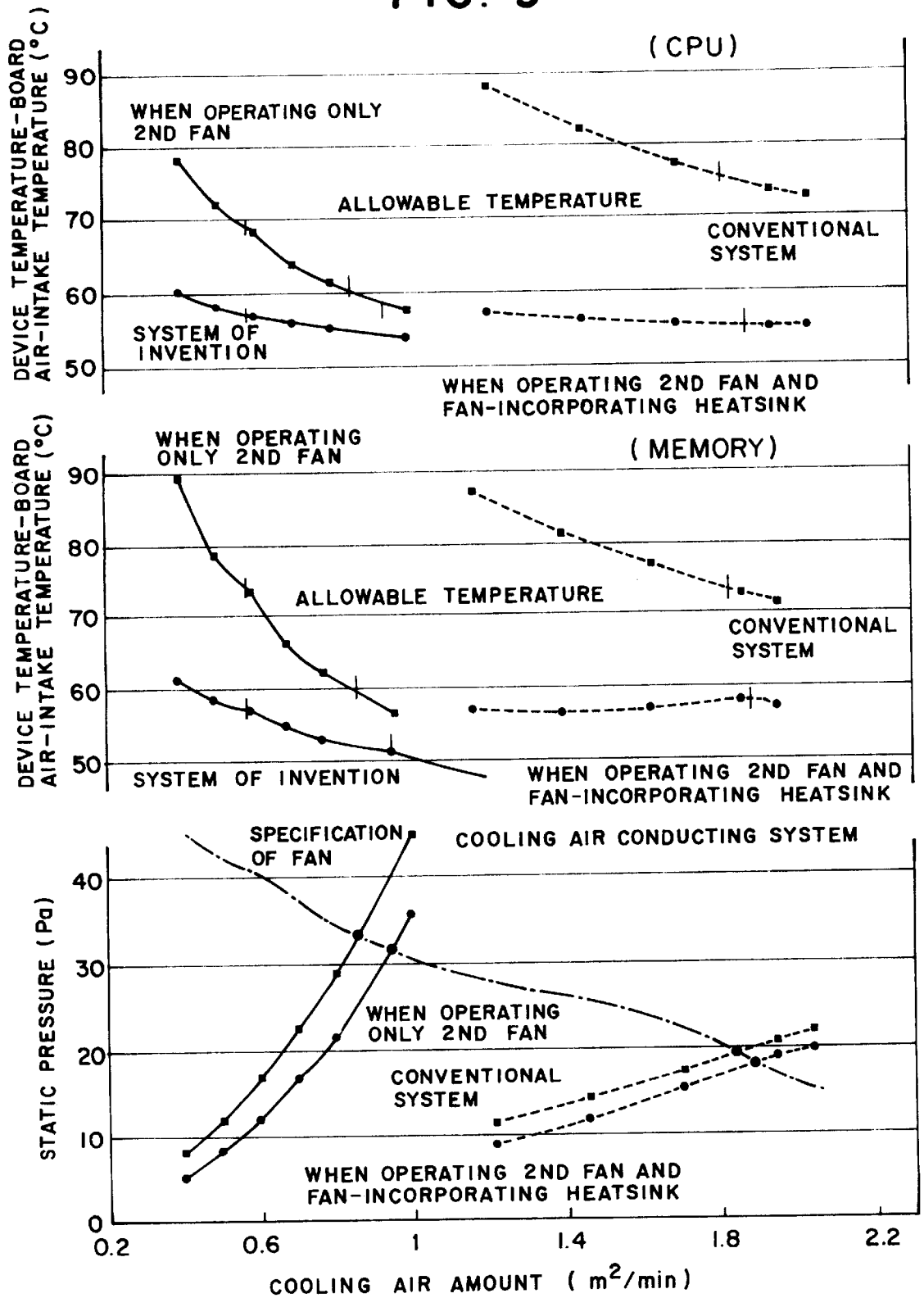
FIG. 9 is a diagram showing the relation between the cooling air amount and the temperature difference, as well as the relation between the cooling air amount and he static pressure.

The above effects of the present invention verified by actual measurements will be described below. FIG. 9 shows the relation between the cooling air amount (the device temperature—the board intake-air temperature) in an embodiment of FIG. 6, and the static pressure. The amount of generation of heat from the LSI package is about 100 W, and the amount of generation of heat from the IC chip is about 2 W. In FIG. 9, solid lines represent a duct system of the present invention, and broken lines represent the conventional system in which cooling air is caused to flow between the boards in parallel relation thereto. The lines with circular marks represent the case where the second cooling fan and the fan-incorporating heatsink were both driven, and the lines with square marks represent the case where the first cooling fan of the fan-incorporating heatsink was stopped, and only the second cooling fan was driven. A dot-and-dash line in the graph showing the static pressure characteristics represents characteristics of a propeller-type cooling fan of a square shape (120 mm square and 38 mm thick). In these tests, the allowable temperature calculated from the normal operation-assuring temperature of the IC chips is about 70° C.

The intersection between the characteristics curve of the cooling fan and the flow passage characteristics curve of each of the duct system and the conventional system is called an operating point, and the temperature with the air quantity at this operating point is the operating temperature. Therefore, when the second cooling fan and the fan-incorporating heatsink are both driven, the device temperature—the board intake-air temperature of the LSI package, the device temperature—the board intake-air temperature of the IC chips, and the cooling air amount are respectively about 54° C., about 51° C. and about 0.96 m$^3$/min. in the duct system, and are respectively about 55° C., about 57° C. and about 1.88 m$^3$/min. in the conventional system. On the other hand, when the first cooling fan of the fan-incorporating heatsink is stopped and only the second cooling fan is driven, the device temperature—the board intake-air temperature of the LSI package, the device temperature—the board intake-air temperature of the IC chips, and the cooling air amount are respectively about 61° C., about 62° C. and about 0.846 m$^3$/min. in the duct system, and are respectively about 75° C., about 73° C. and about 1.84 m$^3$/min. in the conventional system. Namely, the temperature rises of the LSI package and the IC chips immediately before and after the stop of the first cooling fan of the fan-incorporating heatsink are respectively as large as about 20° C. and about 22° C. in the conventional system, whereas the temperature rises are respectively as small as about 7° C. and about 11° C. in the duct system to be about 35% to 50% of those of the conventional system. In the case of the duct system, even when the first cooling fan of the fan-incorporating heatsink is stopped and only the second cooling fan is driven, the temperatures of the devices can be kept below the operation-assuring temperature, but in the case of the conventional system, when the first cooling fan of the fan-incorporating heatsink is stopped and only the second cooling fan is driven, the temperatures of the devices exceed the operation-assuring temperature, so that the reliability is adversely affected. Therefore, for the conventional system, the second cooling fan needs to be larger in size than that used in this test, and this leads to the increase of noises. On the other hand, for the duct system, the second cooling fan used in this test can be replaced by one having a lower cooling capacity, resulting in decrease in noises.

Figure 10:
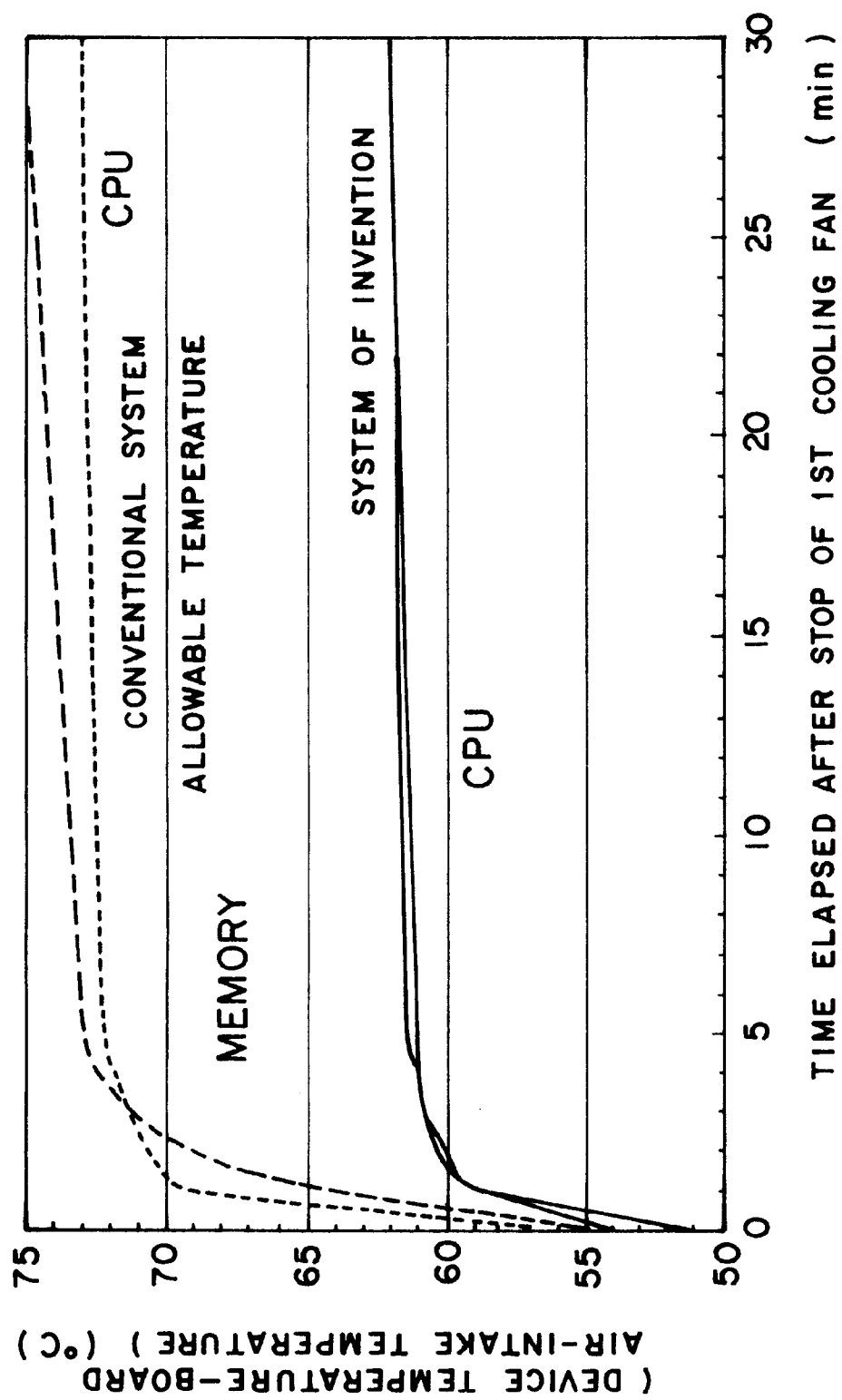
FIG. 10 is a diagram showing the time elapsed after the stop of the first cooling fan in the air-cooled electronic equipment apparatus of the invention, and a temperature rise of the device.
Figure 11A:
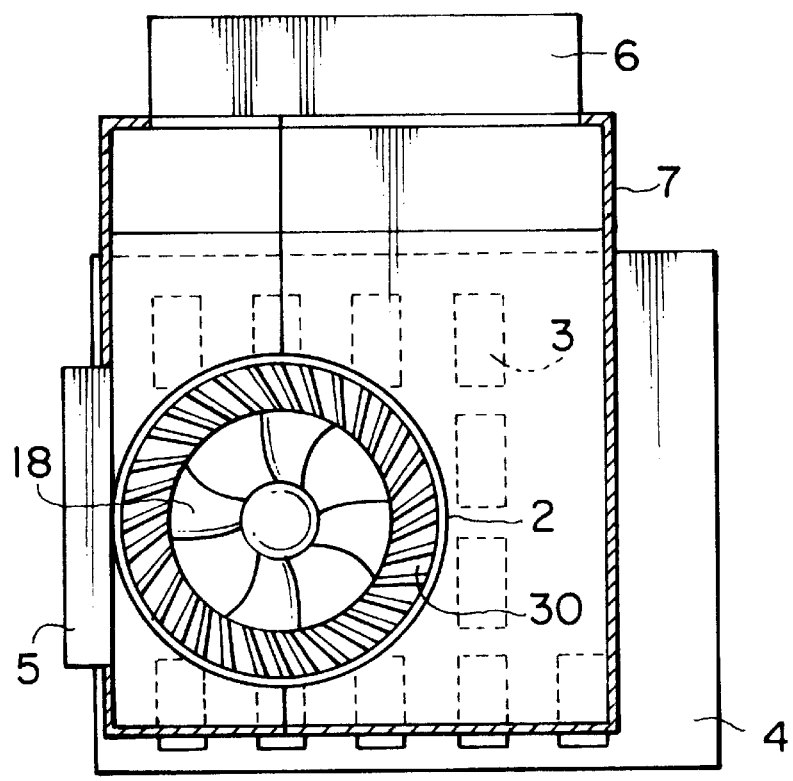
FIG. 11A is a plan view showing a cooling air flow passage in a further embodiment of the invention.
Figure 11B:
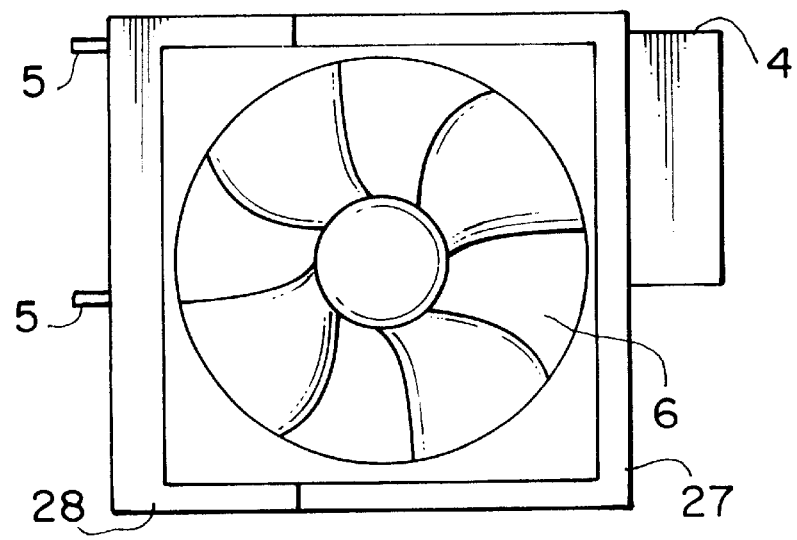
FIG. 11B is a side-elevational view of the cooling air flow,passage of FIG. 11A.

FIG. 10 shows the time elapsed after the stop of the first cooling fan of the fan-incorporating heatsink, and a change of (the device temperature—the board intake-air temperature) of each of the LSI package and the IC chips (the second cooling fan is a propeller-type cooling fan of a square shape (120 mm square and 38 mm thick)). In the conventional system in which the cooling air is caused to flow between the boards in parallel relation thereto, an abrupt temperature rise occurred immediately after the stop of the first cooling fan, and the temperature exceeds the operation-assuring temperature in one or two minutes. On the other hand, in the duct system of the present invention, even when the first cooling fan of the fan-incorporating heatsink is stopped, the temperature will not exceed the allowable temperature, and an abrupt temperature rise does not occur after the stop of the first cooling fan, so that the lifetime of the semiconductor devices can be prolonged.

In the conventional system, when the first cooling fan of the fan-incorporating heatsink is stopped, the apparatus must be immediately stopped in one or two minutes, and in this case, an abnormal mode-detecting sensor must be provided for the first cooling fan. On the other hand, in the duct system of the present invention, the air-cooled electronic equipment apparatus does not have to be immediately stopped, but can be stopped in the same manner as in the normal use. Besides, in some cases, it is not necessary to provide a sensor for detecting the stop of the first cooling fan.

Figure 5A:
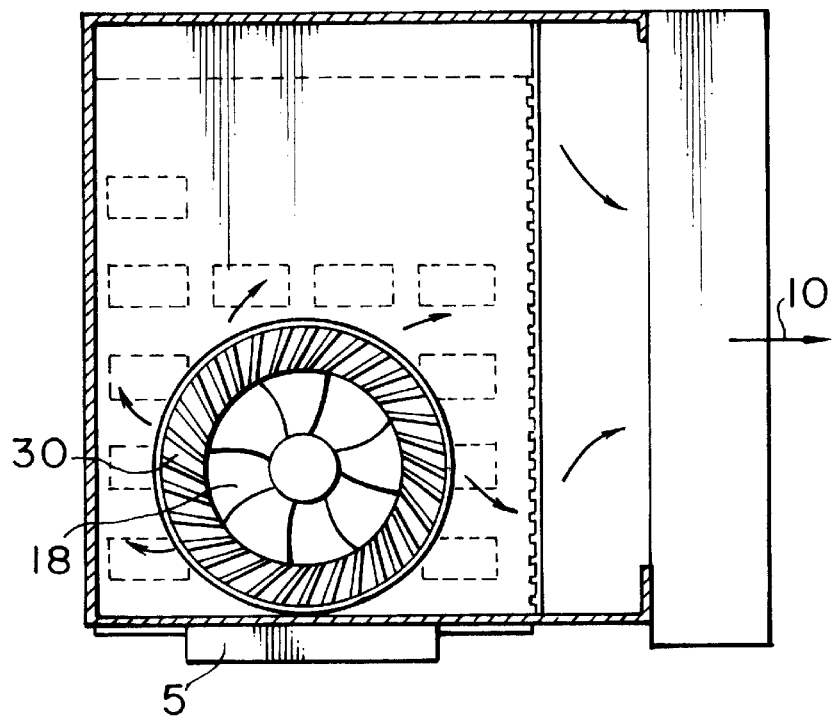
FIG. 5A is a cross-sectional view taken along the line C—C of FIG. 1, showing a flow passage of cooling air in a third embodiment of an air-cooled electronic equipment apparatus of the invention.
Figure 5B:
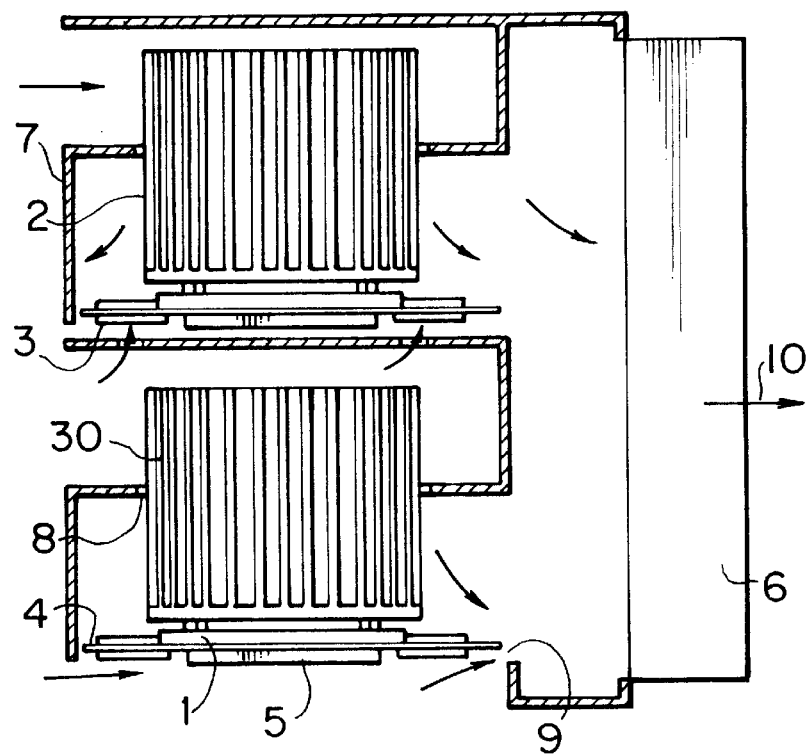
FIG. 5B is a cross-sectional view taken along the line D—D of FIG. 1, showing the cooling air flow passage of FIG. 5A.
Figure 6:
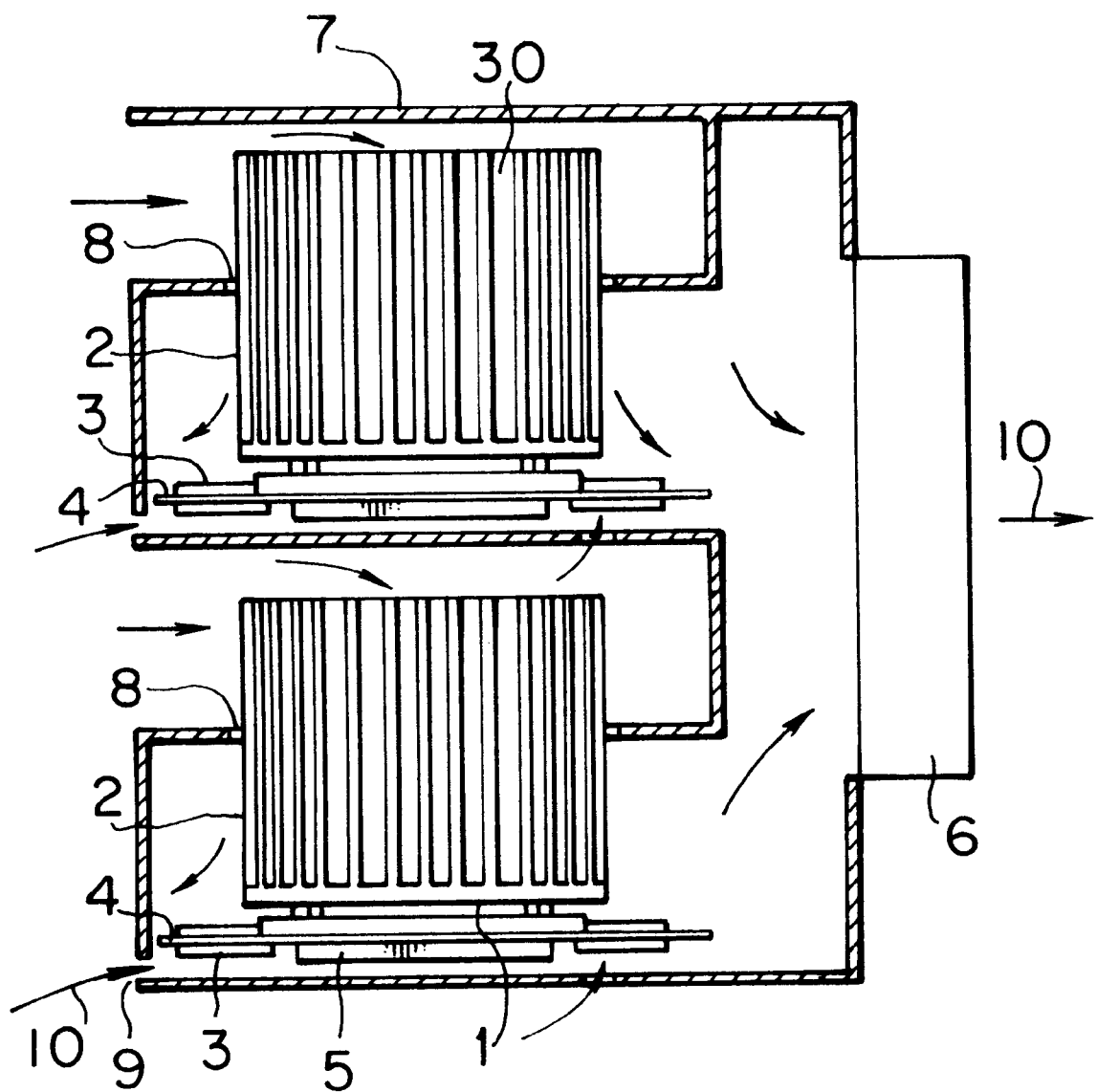
FIG. 6 is a cross-sectional view showing a cooling air flow passage in another embodiment of an air-cooled electronic equipment apparatus of the invention.
Figure 7:
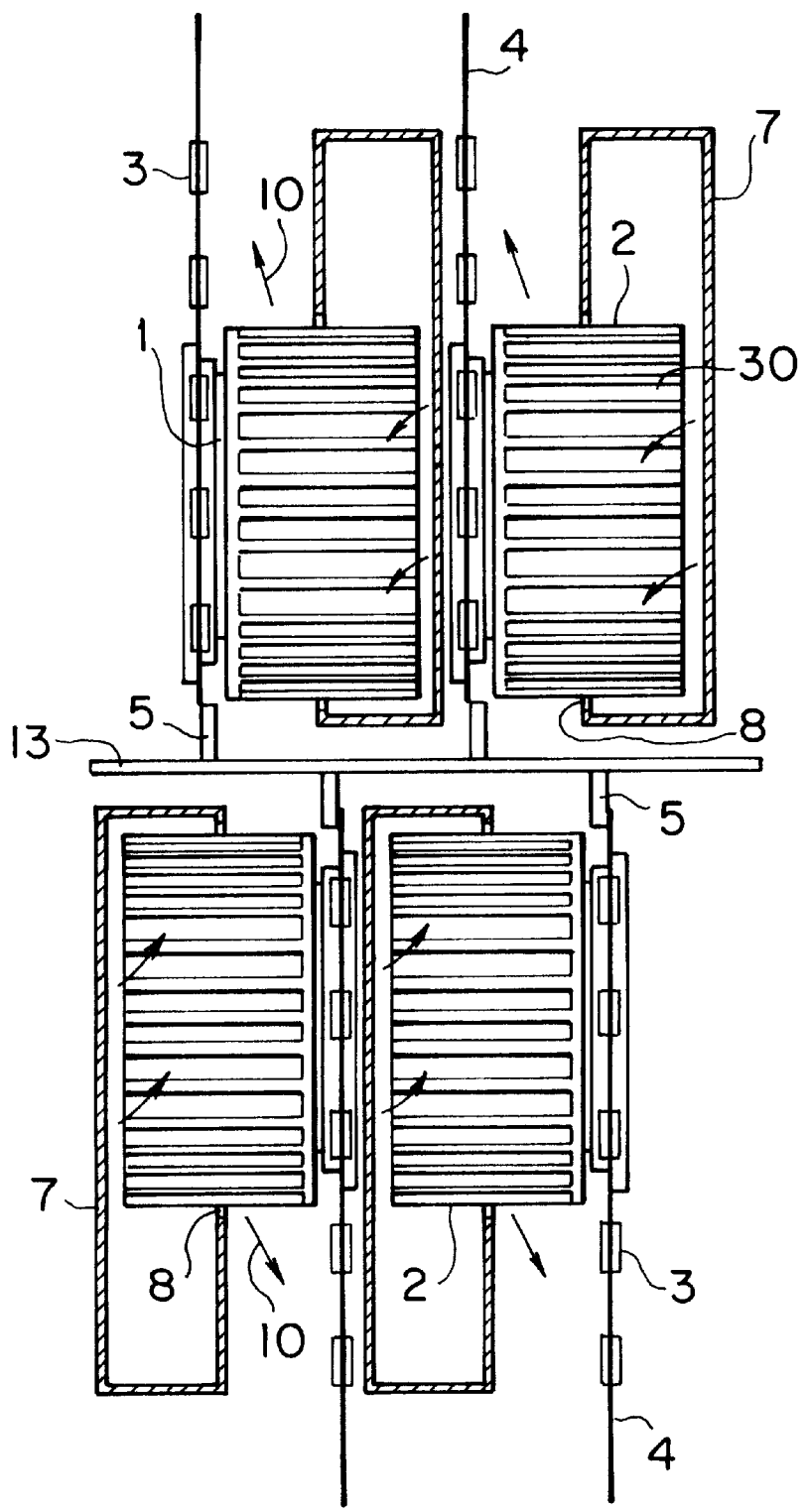
FIG. 7 is a cross-sectional view showing a cooling air flow passage in a further embodiment of an air-cooled electronic equipment apparatus of the invention.

Next, a third embodiment of the invention will be described with reference to FIGS. 5A, 5B, 6 and 7. FIGS. 5 to 7 are cross-sectional views showing cooling air flow passages in an air-cooled electronic equipment apparatus of the third embodiment. FIGS. 5A, 5B and 6 are cross-sectional views showing the cooling air flow passages and the arrangement of boards in the air-cooled electronic equipment apparatus including four boards 4. FIG. 7 is a cross-sectional view showing the cooling air flow passages and the arrangement of boards in the air-cooled electronic equipment apparatus in which two boards 4 are mounted on each side of a platter 13.

Like FIG. 4, FIGS. 5A and 5B show a cross-section C—C and a cross-section D—D, respectively, when a cooling structure is mounted on the electronic equipment shown in FIG. 1.

Figure 4A:
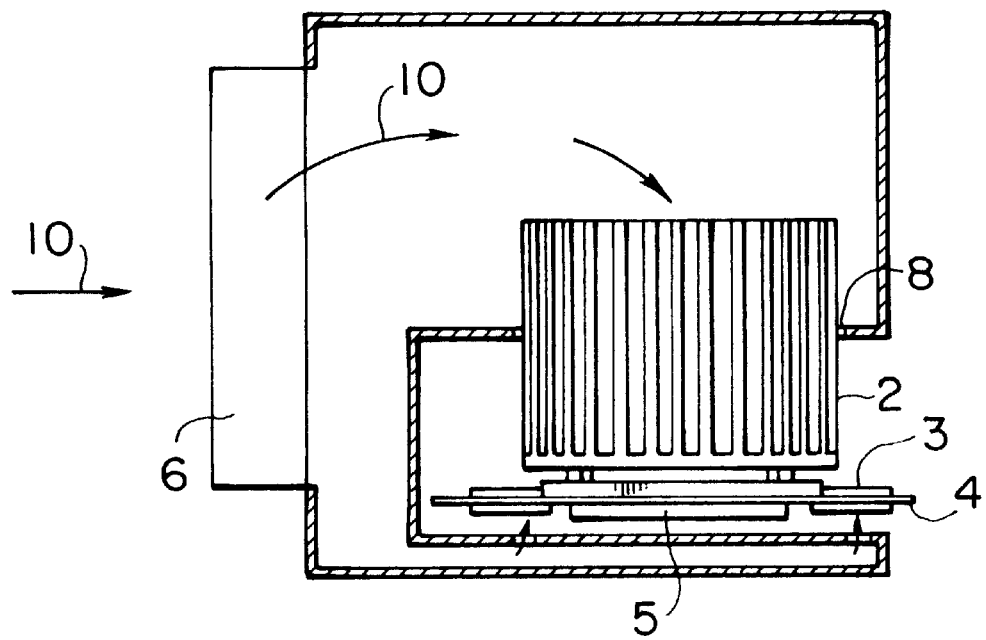
FIG. 4A is a cross-sectional view taken along the line A—A of FIG. 1, showing a modified flow passage of cooling air for heat-generating devices in an air-cooled electronic equipment apparatus.
Figure 4B:
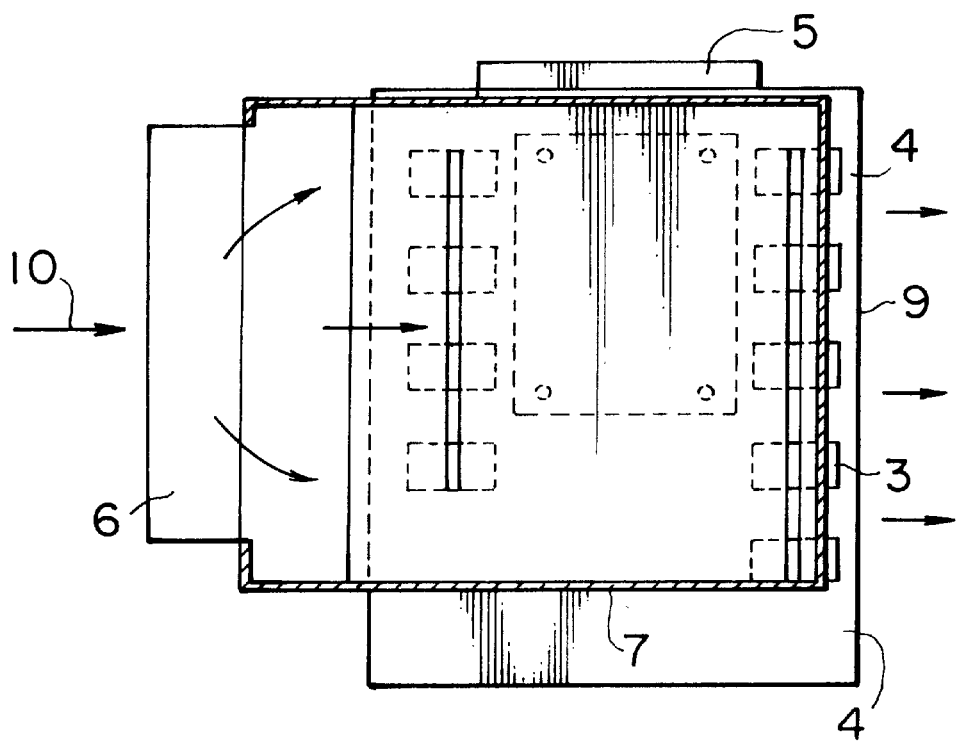
FIG. 4B is a cross-sectional view taken along the line B—B of FIG. 1, showing the cooling air flow passage of FIG. 4A.

The embodiment of FIGS. 5A and 5B differs from the embodiment of FIGS. 4A and 4B in that the two boards 4 as shown FIG. 1 or FIG. 4 are mounted. In FIGS. 5A and 5B, also, an LSI package 1, IC chips 3, and a connector 5 for transmitting and receiving signals and for supplying an electric power are mounted on the board 4 as in the embodiment of FIGS. 4A and 4B. There are provided holes 9 for cooling the IC chips 3 mounted on that side of the upper board 4 facing away from the LSI package 1, as in the embodiment of FIGS. 4A and 4B. There is provided a hole 9 for cooling the IC chips 3 mounted on that side of the lower board 4 facing away from the LSI package 1, as in the embodiment of FIGS. 3A and 3B.

With this arrangement of the flow passages, the cooling air 10 flows basically in the same manner as in the embodiment of FIGS. 4A and 4B except that the cooling air 10 is also supplied to the IC chips 10 mounted on that side of each of the upper and lower boards 4 facing away from the LSI package 1.

These cooling air flow passages are formed by a duct 7, and with this construction even if a gap between a fan-incorporating heatsink 2 and the board 4 disposed in opposed relation thereto is narrow, the cooling air 10 can be positively supplied onto the board 4 through the fan-incorporating heatsink 2, there by cooling the LSI package 1 and the IC chips 3. Namely, the cooling air 10 will not become stagnant in the gap between the board 4 and the fan-incorporating heatsink 2, and the cooling performance of the first and second cooling fans can be fully utilized. Fins of this fan-incorporating heatsink 2 may be replaced by parallel flat plate-type fins or pin-type fins which have heretofore been used.

In this embodiment, by providing the holes 9 for cooling the IC chips 3 as in the second embodiment, the cooling air 10 can be caused to impinge on the IC chips 3 mounted on that side of the board 4 facing away from the LSI package 1 at high speed, and therefore the IC chips 3 radiate heat in a larger amount than the case where the cooling air is supplied to the outer surface of the IC chips 3 in a direction parallel thereto, so that the IC chips 3 are more effectively cooled.

FIG. 6 is a plan view showing a modified form of the embodiment of FIGS. 5 and 5B. A duct 7 is shown in a cross-section A—A of FIG. 1. Explanation of those portions designated by the same reference numerals as used in FIGS. 5A and 5B will be omitted. In the embodiment of FIG. 6, there are provided holes 9 for cooling the IC chips 3 mounted on that side of each of the upper and lower boards 4 facing away from the LSI package 1, as in the embodiment of FIGS. 4A and 4B.

The cooling air 10 is supplied to the IC chips 3 mounted on that side of each of the upper and lower boards 4 facing away from the LSI package 1 through these cooling holes 9, and a variation of the cooling performance depending on the position of mounting of the board 4 can be eliminated.

In this embodiment, the second fan may also have the flow rate substantially equal to the sum of the flow rate values of the first fans or may have a pressure difference ability relative thereto. With this arrangement, the cooling air can be fed to the CPU 1 with the optimum wind-blowing efficiency without wasting the wind-blowing ability of the two fans. In view of a pressure loss of the cooling stream produced in the course from the second fan to the first fan, the ability of the second fan may be higher than the sum of the flow rate values of the first fans or the pressure difference ability thereof, so that the wind-blowing ability achieved by the two fans can be made maximum.

In the embodiments of FIGS. 5A, 5B and 6, although the second cooling fan 6 is disposed downstream of the fan-incorporating heatsink 2, the second cooling fan 6 can be disposed upstream of the fan-incorporating heatsink 2 (see the cross-section A—A in FIG. 1), in which case similar effects can be achieved.

Provided that the second cooling fan 6 is disposed upstream of the board 4, when it is located close to the board 4 and the board 4 is mounted in a position to overlap the axis (i.e., an axis of a motor for rotating the cooling fan 6) of the second cooling fan 6 in the direction of flow of the cooling air 10, then the amount of the wind (cooling air) applied to this board is smaller as compared with the case where the board is mounted in other position, so that the sufficient cooling can not be effected. When the second cooling fan 6 is disposed downstream of the board 4, the cooling air is drawn by the fan, and therefore a generally equal amount of the cooling air 10 can be applied to the boards 4 regardless of the position of the board 4 relative to the axis (i.e., the axis of the motor for rotating the cooling fan 6) of the second cooling fan 6.

As described above, in the present invention, even when the boards 4 each having the fan-incorporating heatsink 2 are mounted in a stacked manner, the cooling air can be supplied to all of the heating devices mounted on the boards 4 without stagnation in the mounting space, and the thermal conduction between these devices and the air is made good, so that the device temperatures can be made substantially equal to one another.

FIG. 7 is a plan view of the embodiment in which four boards 4 as shown in FIG. 1 are mounted, and more specifically the two boards 4 are mounted on each side of the platter 13. A duct 7 is shown in its cross-section through the central portion of the fan-incorporating heatsink 2 of FIG. 1. As in the embodiment of FIGS. 5A and 5B, an LSI package 1, IC chips 3, and a connector 5 for transmitting and receiving signals and for supplying an electric power are mounted on the board 4. A hole 8 having a size larger than an outer size of a fan-incorporating heatsink 2 is formed in the duct 7, and a part of the fan-incorporating heatsink 2 extends through this hole 8 into the duct 7. With this mounting arrangement, the computation performance can be made about twice higher than that achieved by the embodiment of FIGS. 5A and 5B to make the duct system easily applicable.

Figure 8A:
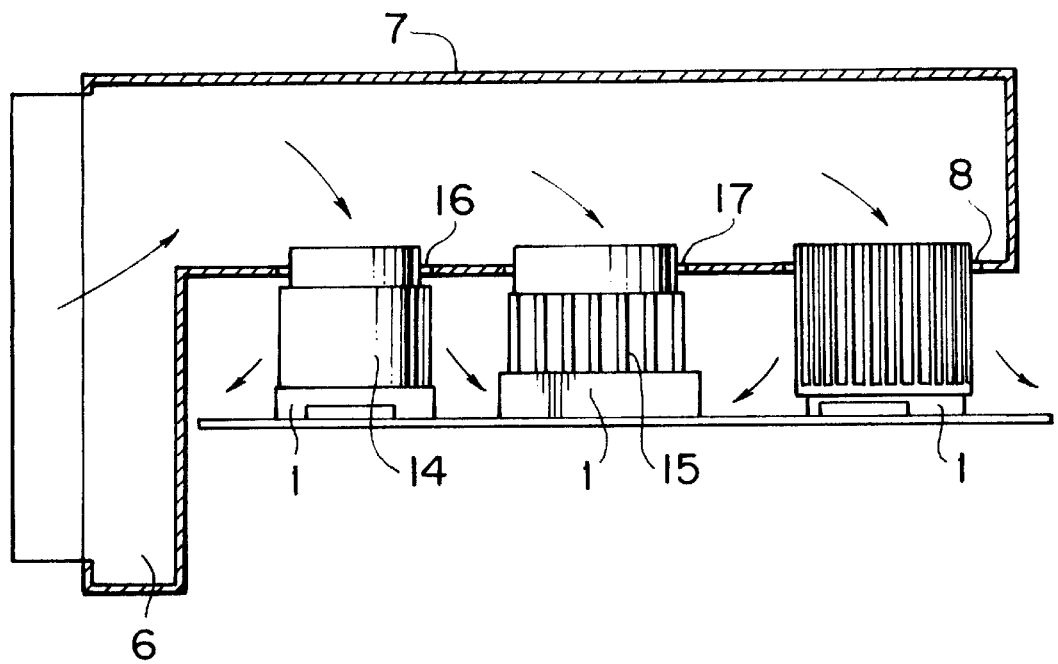
FIG. 8A is a cross-sectional view taken along the line A—A of FIG. 1, showing a flow passage of cooling air in a fourth embodiment of an air-cooled electronic equipment apparatus of the invention.
Figure 8B:
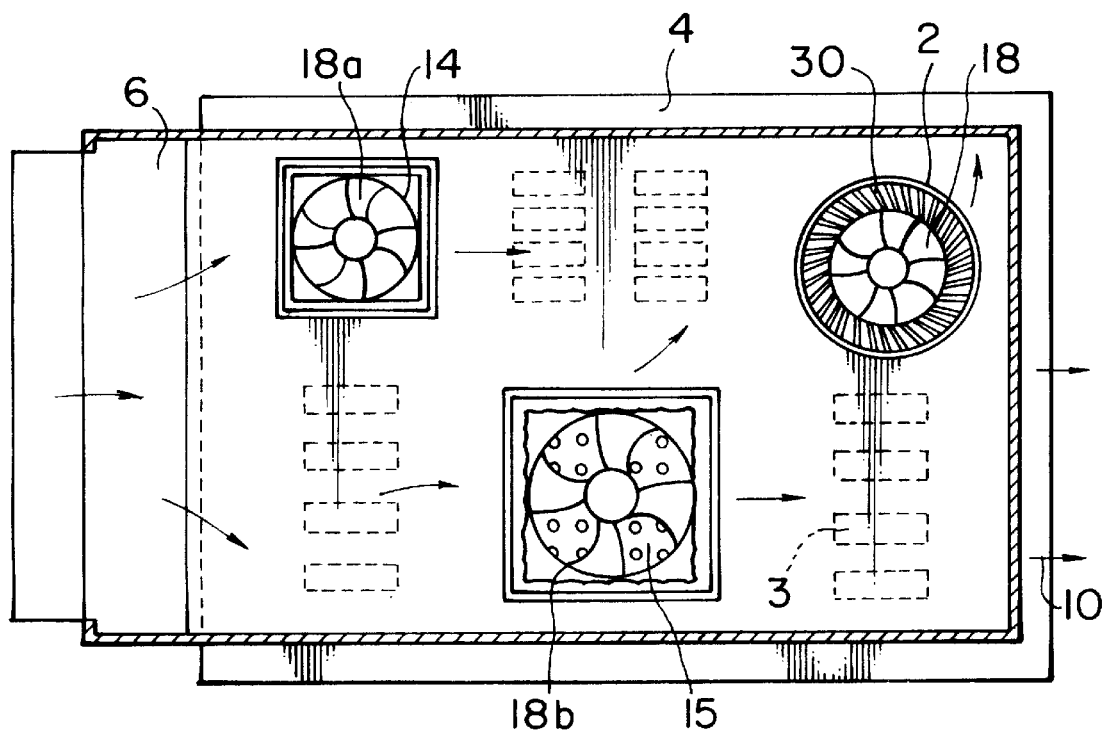
FIG. 8B is a cross-sectional view taken along the line B—B of FIG. 1, showing the cooling air flow passage of FIG. 8A.

Next, a fourth embodiment of the invention will be described with reference to FIGS. 8A and 8B. FIGS. 8A and 8B are a vertical cross-sectional view and a plan view, respectively, showing a flow passage of cooling air in the fourth embodiment of an air-cooled electronic equipment apparatus of the invention.

In this embodiment, as shown in FIGS. 8A and 8B, a plurality of LSI packages, a spiral fin-type fan-incorporating heatsink 2 having a fan with spiral fins 30, a parallel flat plate fin-type 14, a pin fin-type 15, and IC chips 3 are mounted on a common board 4, and there is provided a duct 7 forming the flow passage for cooling air 10.

As in the spiral fin-type fan-incorporating heatsink 2, a first cooling fan 18 is incorporated on an upper surface of a heatsink of each of the parallel flat plate fin-type 14 and the pin fin-type 15. A hole 8 for cooling the fan-incorporating heatsink 2, a hole 16 for cooling the parallel flat plate fin-type, and a hole 17 for cooling the pin fin-type are formed in the duct 7, the size of each hole being larger than an outer size of the associated heatsink. Part of the fan-incorporating heatsink 2, part of the parallel flat plate fin-type 14 and part of the pin fin-type 15 extend respectively through the holes 8, 16 and 17 into the duct 7.

The cooling air 10 is drawn through an intake port of a second cooling fan 6 to increase the pressure within the duct 7, and the cooling air is blown from the cooling holes 8, 16 and 17 provided respectively for the fan-incorporating heatsink 2, the parallel flat plate fin-type 14 and the pin fin-type 15. The cooling air 10 having flowed into each of the fan-incorporating heatsink 2, the parallel flat plate fin-type 14 and the pin fin-type 15 first flows into the first cooling fan 18 incorporated in each of the fan-incorporating heatsink 2, the parallel flat plate fin-type 14 and the pin fin-type 15, and then passes through the heatsink of each of the fan-incorporating heatsink 2, the parallel flat plate fin-type 14 and the pin fin-type 15 to be supplied to the IC chips 3 mounted on that side of the board 4 on which the LSI packages 1 are mounted.

When the amount of generation of heat from the LSI packages 1 becomes large, the temperature of the heatsinks of the spiral fin-type fan-incorporating heatsink 2, the parallel flat plate fin-type 14 and the pin fin-type 15 also becomes high, so that the temperature of the cooling fans connected respectively to these heatsinks also becomes high.

Therefore, as in the first, second and third embodiments, there is a high possibility that the first cooling fan 18 of the fan-incorporating heatsink 2 is stopped.

In the conventional system in which the cooling air is caused to flow parallel to the board 4, when the cooling fan of any of the fan-incorporating heatsink 2, the parallel flat plate fin-type 14 and the pin fin-type 15 is stopped, the fan-incorporating heatsink 2, the parallel flat plate fin-type 14 and the pin fin-type 15 form a barrier to the flow of the cooling air, so that the cooling air 10 can not be sufficiently supplied to the downstream-side IC chips 3, which results in a problem that the temperature of the downstream-side IC chips 3 rises extremely and abruptly.

Therefore, not only those IC chips 3 operating in connection with the LSI package 1 whose associated fan 18 is stopped, but also other LSI package and IC chips disposed adjacent thereto increase in temperature, and therefore in the conventional system, when one of the fans is stopped, the supply of an electric power to the board 4 is immediately stopped to thereby stop the operations of all of the semiconductor devices on the board 4. In this case, before the supply of the electric power is stopped, data stored in the IC chips 3 and the LSI packages 1 are hardly protected, or even if such protection is effected, it is quite possible that only minimum necessary data can be obtained when the apparatus is activated again.

In order to overcome this problem, it is necessary to increase the cooling capacity of the second cooling fan 6, which leads to a large-size design of the cooling fan, and besides noises produced by the apparatus increase.

On the other hand, in the present invention, the second cooling fan 6 and the first cooling fans 18 are provided in the flow passage of the cooling air 10 formed by the duct 7 in the direction of flow of the cooling air 10, and besides the flow passage formed by the duct 7 is so designed that the above cooling air 10 can be directed toward the board or the heat-generating devices. Therefore, the cooling air 10 flows into the fan-incorporating heatsinks, and is blown to the board 4 through the heatsinks, as in the first embodiment.

Therefore, even if any of the first cooling fans 18 on the board 4 is stopped, the second cooling fan 6 can serve as a cooling fan for the fan-incorporating heatsink 2, the parallel flat plate fin-type 14 and the pin fin-type 15 on the board. In this case, the cooling air 10 can also be fed toward the board through an upper portion of the fan-incorporating heatsink 2 and an inlet of the first cooling fan 18, and is further blown from the heatsink, so that the LSI package 1 and the IC chips 3 can be cooled. Besides, the cooling air 10 is blown off from the periphery of the heatsink 2 generally uniformly with respect to the center of the heatsink 2, and therefore the IC chips 3 are cooled uniformly. Furthermore, the flow passage formed by the duct 7 is so designed that the above cooling air 10 can be directed toward the board or the heat-generating devices, so that the cooling air 10 flows into the fan-incorporating heatsink to be blown to the board 4 through the heatsink.

Therefore, even if any of the first fans 18 on the board 4 is stopped, the temperature rise of the associated LSI package 1 can be suppressed. Therefore, before the device temperature of the LSI package 1 rises to an upper limit of an allowable temperature range in which the LSI can operate, without stopping the supply of the electric power to the board 4, there can be provided a sufficient time for data, which are stored in the LSI package 1 and the IC chips 3 corresponding to this LSI package 1, to be stored in or transferred to an external memory device or the other LSI package 1 and IC chips 3.

In this construction of the present invention in which the plurality of LSI packages 1 are mounted on the board 4, even if the first cooling fan 18 of any of the fan-incorporating heatsinks 2 is stopped, the cooling air 10 can be fed toward the board through the upper portion of the fan-incorporating heatsink 2 and the inlet of the first cooling fan 18 to cool the LSI package 1, the IC chips 3 and the board 4. Therefore, the device temperatures of the LSI packages 1 and IC chips 3 are prevented from abruptly rising, and even if any of the plurality of the LSI packages 1 is stopped, it is not necessary to stop the supply of the electric power to all of the devices on the board, but it is only necessary to stop the supply of the electric power to the corresponding devices. Besides, before the device temperature of the LSI package 1 rises to the upper limit of the allowable temperature range, the data stored in this LSI package 1 and the associated IC chips 3 can be stored in or transferred to other memory device.

In the embodiment of FIGS. 8A and 8B, the electronic parts are mounted on one side of the single board, and similar effects can also be achieved with a stack-mounting construction and double-sided mounting construction.

Figure 12:
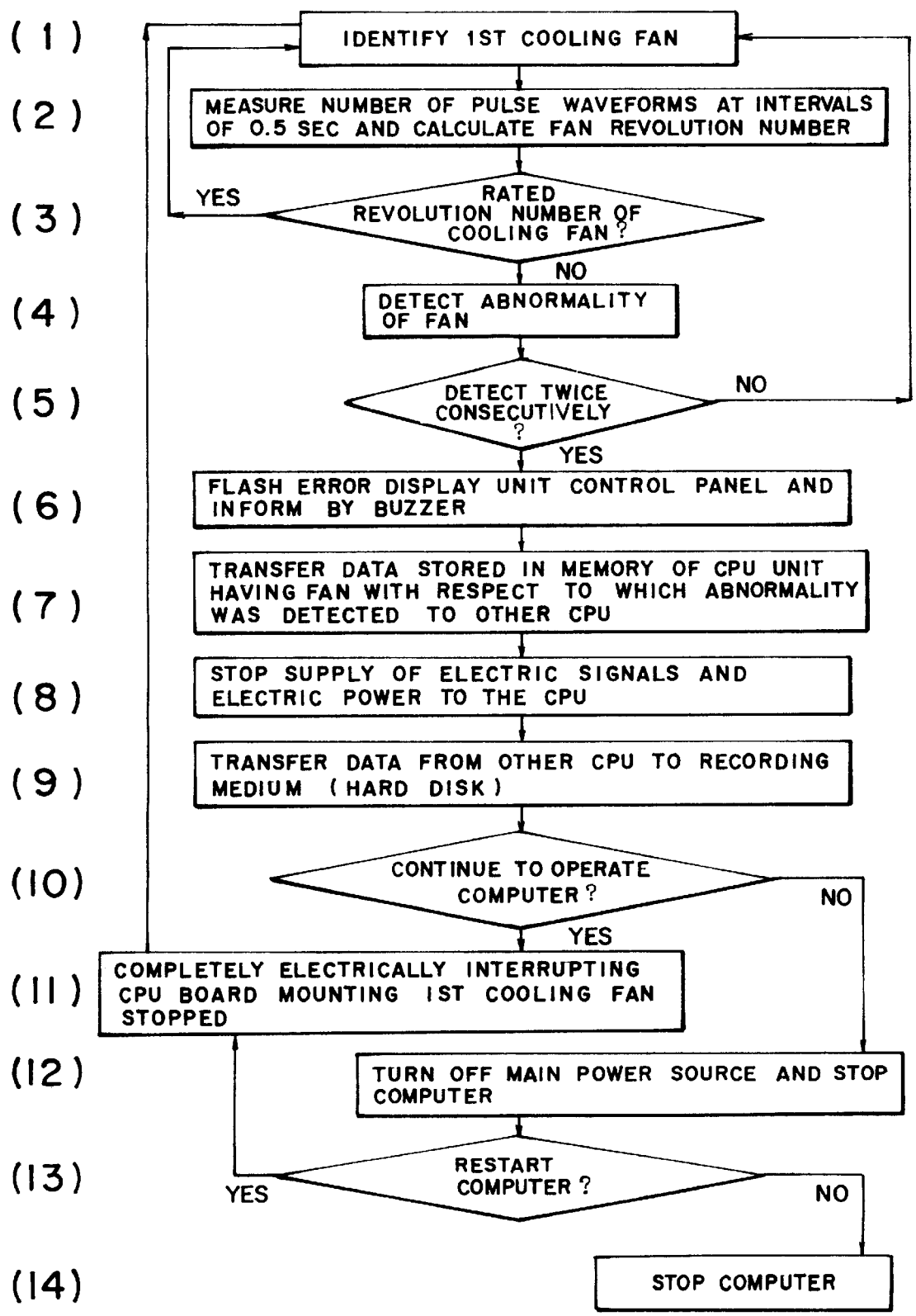
FIG. 12 is a flow chart of a computer control at the time of stop of a cooling fan in a fifth embodiment of an air cooled electronic equipment apparatus of the invention.
Figure 13:
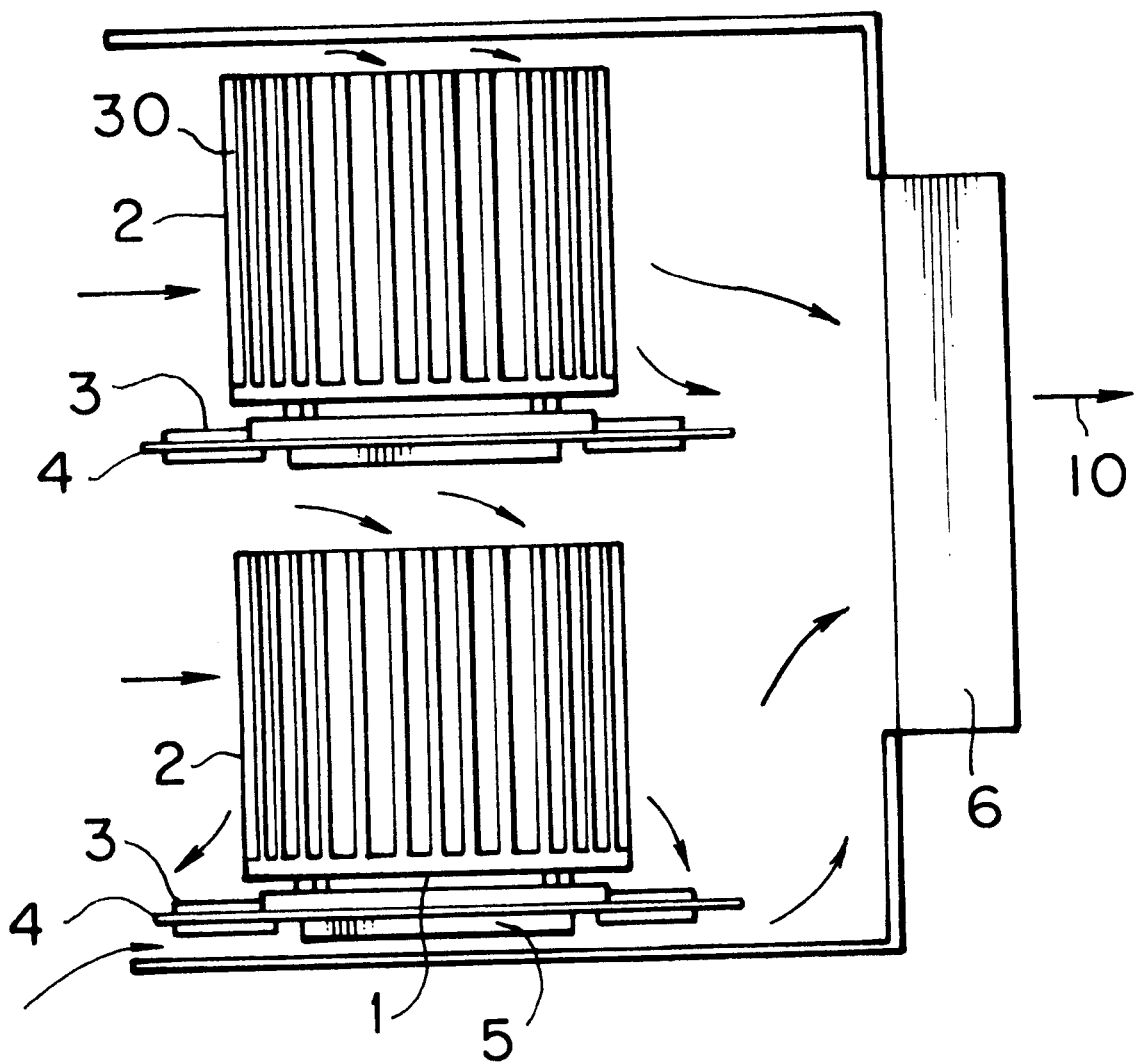
FIG. 13 is a view showing a conventional construction in which cooling air is caused to flow parallel to CPU board.
Figure 14:
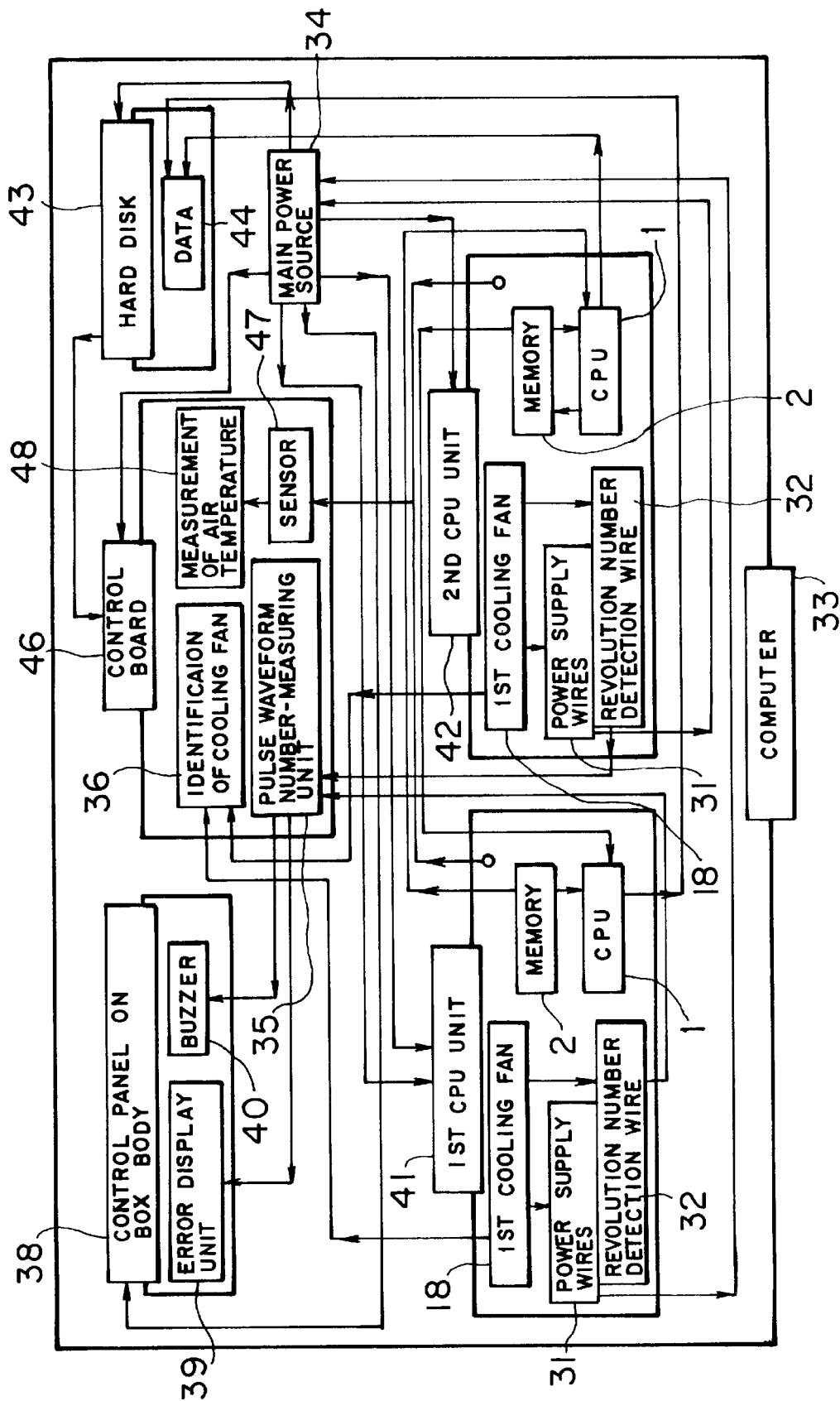
FIG. 14 is a block diagram showing the construction of the fifth embodiment of the air-cooled electronic equipment apparatus of the invention.

Next, a fifth embodiment of the invention will be described with reference to FIGS. 12 and 14. FIG. 12 is a flow chart of a data protection processing effected when the cooling fan is stopped in the fifth embodiment of an air-cooled electronic equipment apparatus of the invention, and FIG. 14 is a block diagram showing the construction of the air-cooled electronic equipment apparatus of the fifth embodiment. A sequence of operations of the apparatus of FIG. 14 are shown in FIG. 12.

FIG. 14 shows the construction of a control system which effects the above data protection when the cooling fan of the above fan-incorporating heatsink is stopped. In this embodiment, a computer 33 comprises a control panel 38, control board 46, hard disk 43, main power source 34, first CPU unit 41 and a second CPU unit 42. The CPU units are varied in accordance with the specification of the apparatus, and in the present invention, the number of the CPU units is not limited to a specified number.

The control panel 38 has an error display unit 39, a buzzer 40 and so on. The control board 46 has a cooling fan identification unit 36, a pulse waveform number-measuring unit 35 for detecting an output from a revolution number detector such as an encoder connected to the cooling fan, and also has a function 48 for measuring the temperature of the air by a sensor 47, such as a thermistor, for measuring the temperature or humidity within the computer 33. Data 44, including software used by the user of the computer 33, results of computations, and an OS, are recorded in the hard disk 43 to be suitably read and written. The control panel 38, the control board 46, the hard disk 43, the first CPU portion 41 and the second CPU portion 42 are connected to the main power source 34, and are supplied with electric power independently of one another.

The first CPU unit 41 and the second CPU unit 42 have substantially the same construction, and each of these units 41 and 42 has a CPU 1, a memory 2 and a first cooling fan 18. Power supply wires 31 (a plus wire and a minus wire) and a revolution number detection wire 32 are connected to the first cooling fan 18, the power supply wires 31 are connected to the main power source 34, the revolution number detection wire 32 is connected to the pulse waveform number-measuring unit 35 mounted on the control board 46, and this pulse waveform number-measuring unit 35 detects an abnormal condition of the fan by the pulses fed thereto.

Although not shown in the drawings, the computer 33 is provided with a second cooling fan 6 for cooling the CPU units 41 and 42, and electric power is supplied from the main power source 34 to the second cooling fan 6. As in the first cooling fan 18, an output from a revolution number detector is fed to the pulse waveform number-measuring unit 35 to provide detection of the number of revolutions of the second fan 6.

As described above, the second fan 6 supplies cooling air to the plurality of first cooling fans 18, and usually, its flow rate and pressure difference ability are much higher than those of the first cooling fan 18. Unlike the first cooling fans 18, the second cooling fan 6 is provided in spaced relation to the CPUs 1 constituting main heat sources of the CPU units 41 and 42, respectively. Therefore, the direct thermal influence of the CUPs (heat sources) on the second cooling fan 6 is small, so that the lowering of the reliability such as a shortened lifetime due to the heat is not so much problematic.

Therefore, the probability that the second cooling fan 6 stops is extremely smaller than the case of the first cooling fan 18. However, if the second cooling fan 6 should be stopped, all of the CPUs are subjected to the influence of the reduced amount of the cooling air 10, and the devices are destroyed over an extremely wide area. Therefore, when the stop of the second cooling fan is detected, the supply of the electric power to all of the CPU units is immediately stopped, and the whole of the apparatus, that is, the computer 33, is stopped. This procedure has been effected also in the prior art techniques. Therefore, the operation of the control system of the air-cooled electronic equipment apparatus, according to the invention, at the time of stop of the first fan will be described.

The CPU 1 of each of the first and second CPU units 41 and 42 receives data from the memory 2, and processes or computes these data, and stores them in the memory 2. These data are transferred as data 44 to the hard disk 43 by the CPU 1 or a memory controller (not shown). Each memory 2 is connected also to the CPU 1 of the other CPU unit, and the stored data can be read and written by the other CPU. The first cooling fan 18 is connected to the cooling fan identification unit 36 on the control board 46, and for example, through a binary notation, the cooling fan whose revolution number is now detected by the pulse waveform number-measuring portion 35 can be identified.

The operation of the fifth embodiment of the invention, having the above construction, will now be described. The pulse waveform number-measuring unit 35 on the control board 46 is connected to the error display unit 39 and the buzzer 40 mounted on the control panel 38. Therefore, if the stop of the first cooling fan 18 of one of the CPU units 41 and 42, or the reduction of the revolution number thereof, is detected by the pulse waveform number-measuring unit 35 as an abnormal rotation, the control panel 46 feeds a signal to the control panel 38 to cause the occurrence of the abnormality of the CPU 1 to be displayed on the error display unit 39 on a box body, thus informing the user of the computer 33 of this abnormality. If a terminal is connected to the computer 33, the occurrence of this abnormality may be displayed on this terminal instead of displaying it on the control panel on the box body.

Further, instructions are sent to the CPUs 1, so that the data used for computations by the CPU 1 of the CPU unit with respect to which the abnormal revolution number has been detected, and the data (data of results of the computations) stored in the associated memory 2 are read by the CPU1 of the other CPU unit 1 to be transferred to the other CPU, the memory 2 in this CPU unit, or the hard disk 43. These data contain one necessary for re-activating the computer after main power source of the computer is stopped. The hard disk 43 is connected to the control board 46, and the monitoring can be effected so as to judge whether or not the data 44 has been stored in the hard disk 43. Then, when it is confirmed that the transferring of the data has been completed, the main power source ceases to supply the electric power to the CPU whose associated fan 18 has been stopped. At this time, there may be used a procedure in which the temperature of the interior of the computer is measured by the temperature sensor 47, and at the same time changes of the device temperatures in the CPU1 whose associated fan has been detected to be stopped are measured, and from this change with time, a time available before the device temperatures reach the upper limit of the allowable temperature range, in which the devices can operate, is estimated, and the data to be transferred is selected.

As described above, in the construction of the invention, even if the first cooling fan 18 of one of the fan-incorporating heatsinks 2 is stopped, the cooling air 10 is directed toward the board through the fan-incorporating heatsink 2, and therefore the device temperature is prevented from abruptly rising, and even if any of the plurality of LSI packages 1 is stopped, it is not necessary to stop the supply of the electric power to all of the devices on the board, but it is only necessary to stop the supply of the electric power to the corresponding devices. Besides, before the device temperature rises to the upper limit of the allowable temperature range, there can be provided a sufficient time for the necessary data to be transferred to the other CPU, the memory or the external memory device.

The value of a CPU clock may be varied so that the time available before the device temperature reaches the upper limit of the allowable temperature range can be prolonged.

Next, a flow of the control of the air-cooled electronic equipment apparatus of the invention effected when the first cooling fan of the fan-incorporating heatsink is stopped will be described with reference to FIG. 12.

The identification of the first cooling fan is always effected (Step 1). The number of pulse waveforms for the identified fan is measured at time intervals of 0.5 second, and a value twice larger than the thus measured value corresponds to the number of revolutions of the fan (Step 2). It is judged whether or not this revolution number is the rated revolution number (Step 3). At this time, the judgment criterion is ±10% of the rated revolution number. If this judgment result is "YES", the program returns to the fan identification of Step 1. If this judgment result is "NO", abnormality of the cooling fan is detected (Step 4). It is judged whether or not the detection of this cooling fan abnormality is effected twice consecutively (Step 5). If this judgment result is "NO", the program returns to the cooling fan identification of Step 1. If this judgment result is "YES", the display unit on the control panel on the box body is flashed, and the buzzer informs the user of the abnormality (Step 6). The data stored in the memory of the CPU unit having the cooling fan with respect to which the abnormality has been detected is transferred to the other CPU (Step 7). The supply of the electric power and electric signals to the CPU unit having the cooling fan with respect to which the abnormality has been detected is stopped (Step 8). Therefore, the localized temperature rise of this CPU 1 after the stop of the first cooling fan 18 can be prevented. Then, the data transferred to the other CPU is transferred to the recording medium such as the hard disk (Step 9). It is judged whether or not the computer should continue to be operated (Step 10). If this judgment result is "YES", the CPU board having the stopped first cooling fan mounted thereon is completely interrupted electrically (Step 11). Thereafter, the program returns to the first cooling fan identification of Step 1. If this judgment result is "NO", the main power source is turned off to stop the computer (Step 12). Therefore, a predetermined time necessary for the shut-down of the system can be secured. Then, it is judged whether or not the computer is re-activated (Step 13). If this judgment result is "YES", the CPU board having the stopped first cooling fan mounted thereon is completely interrupted electrically (Step 11), and the program returns to the first cooling fan identification of Step 1. If this judgment result is "NO", the computer remains stopped (Step 14).

In this construction of this embodiment, after the first cooling fan 18 is stopped, the localized temperature rise of the CPU1 corresponding to this cooling fan 18 can be prevented, and the predetermined time required for the protection of the necessary data before the shut-down of the system can be secured. Besides, after the data is protected, only the relevant CPU unit can be electrically interrupted, therefore the data necessary for re-activating the computer is not lost, and the reliability of the computer can be enhanced to a maximum degree.

When the abnormal rotation is measured in the pulse waveform number-measuring unit 35, the control board 46 feeds a signal to the control panel 38, thereby causing the occurrence of the abnormality of the CPU1 to be displayed on the error display unit 29 on the box body, thus informing the user of the computer 33 of this abnormality. If a terminal is connected to the computer 33, the occurrence of the abnormality may be displaced on this terminal instead of displaying it on the control panel on the box body.

Figure 19A:
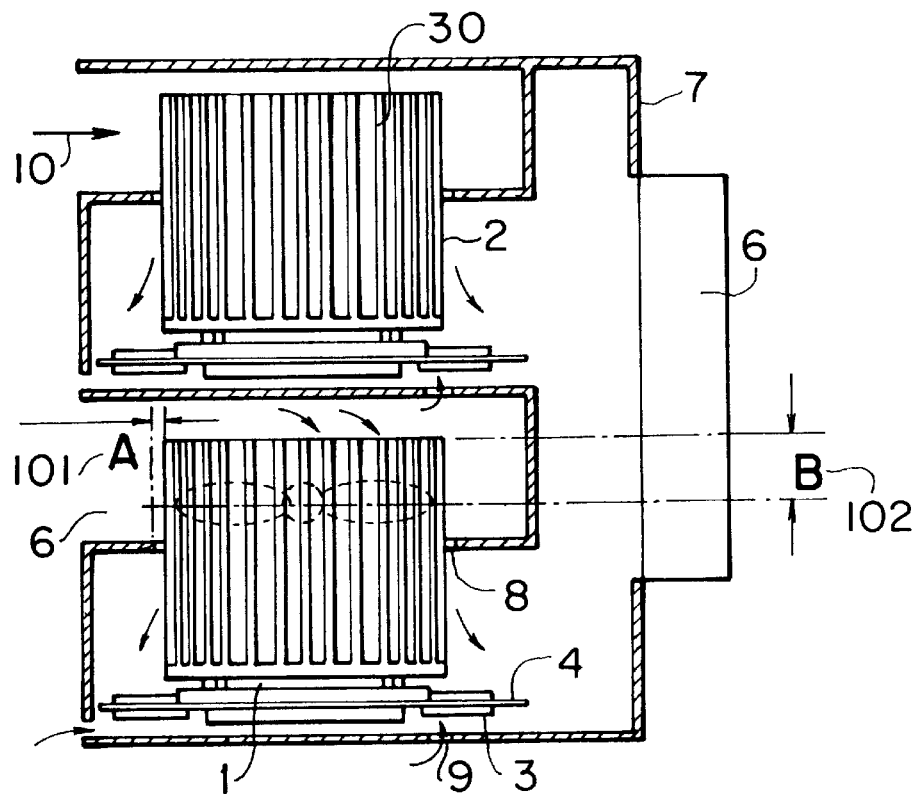
FIG. 19A is a cross-sectional view taken along the line C—C of FIG. 1, showing a cooling air flow passage in a further embodiment of an air-cooled electronic equipment apparatus of the invention.
Figure 19B:
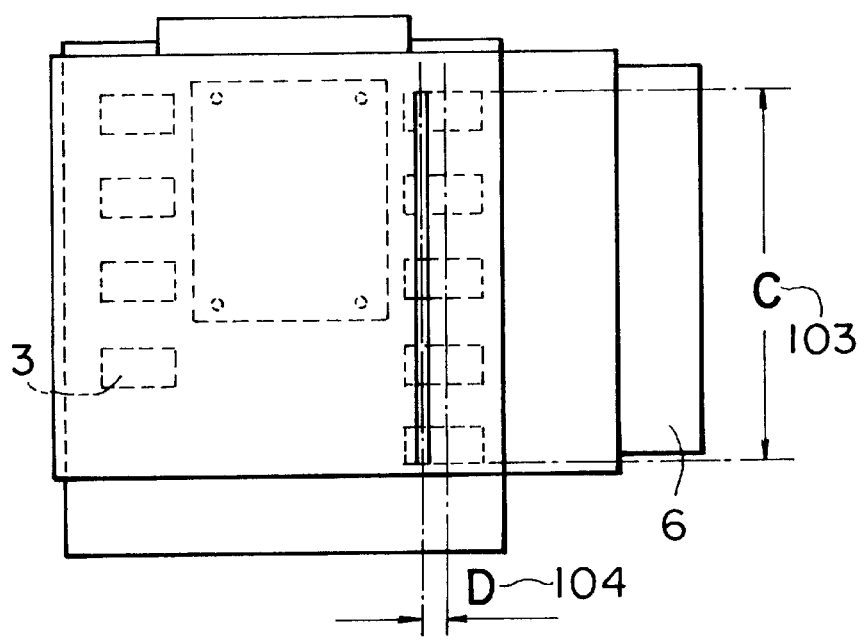
FIG. 19B is a cross-sectional view taken along the line D—D of FIG. 1, showing the cooling air flow passage of FIG. 19A.

Next, the optimum configuration with respect to a fan-incorporating heatsink and a jet duct of the invention will be described. FIGS. 19A and 19B show an embodiment similar to the embodiment of FIG. 6, in which a first cooling fan 6 is disposed downstream of a group of CPU boards 4, and an upstream-side one of cooling holes 9 for cooling memories mounted on that side of each CPU board 4 facing away from a CPU mounted thereon is disposed adjacent to an upstream-side end of the CPU board 4. The optimum configuration is determined by four points including a gap 101(A) between the fan-incorporating heatsink received in a CPU-cooling hole 8 and a cooling air guide member (the jet duct), the distance (deviation) 102(B) between the centerline of blades of a second cooling fan and the cooling air guide member (jet duct) in a direction of the height, a width 103(C) of the duct hole for cooling the memories on that side of the CPU board facing away from the CPU, and the distance (deviation) 104(D) between the centers of the memories on that side of the CPU board facing away from the CPU and the centerline (axis) of the memory-cooling jet duct hole.

Figure 15:
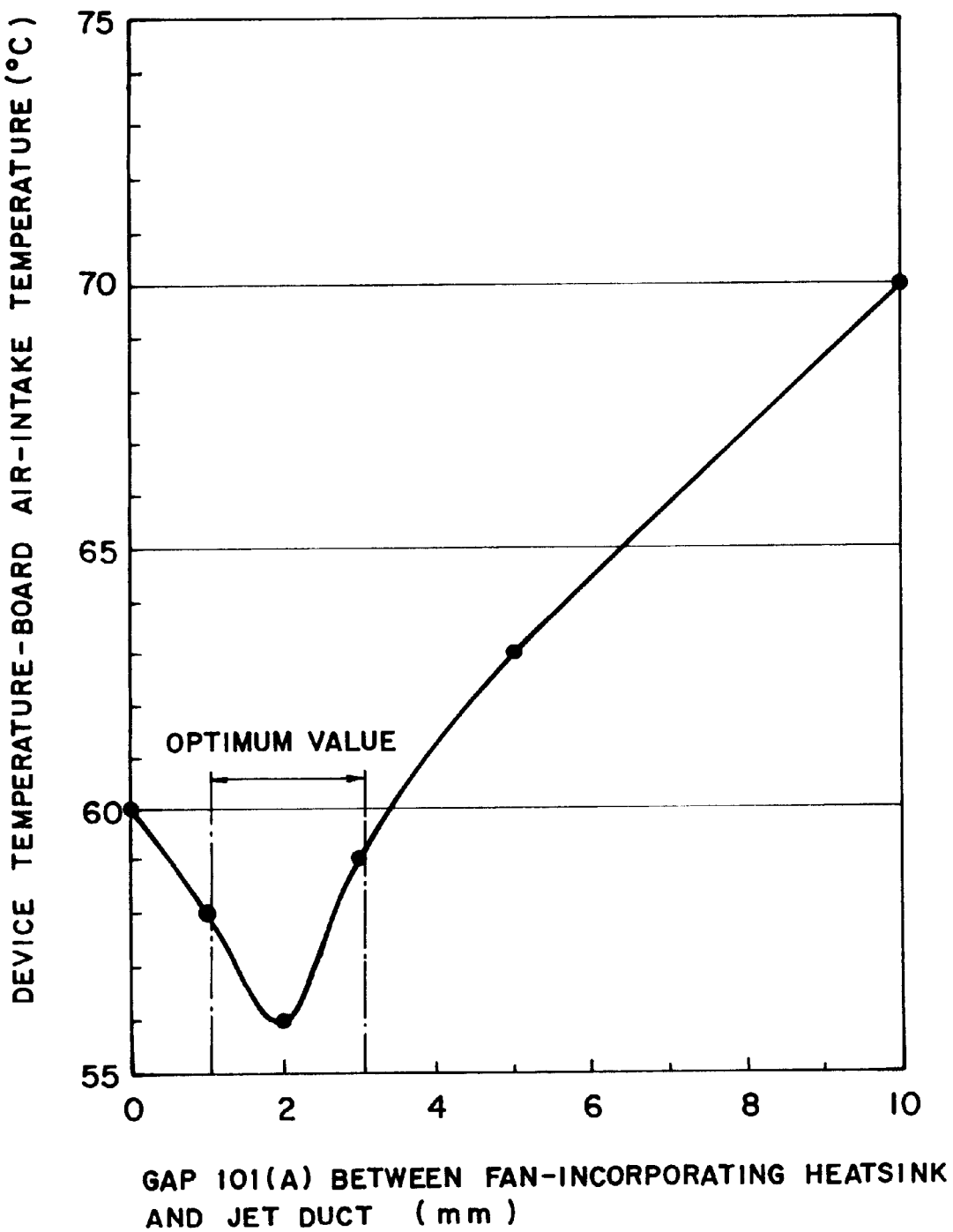
FIG. 15 is a graph showing the relation between a gap A formed between a fan-incorporating heatsink and a cooling air guide member (jet duct) in an air-cooled electronic equipment apparatus of the invention, and the temperature difference.

The optimum configuration of the gap 101(A) between the fan-incorporating heatsink received in the CPU-cooling hole 8 and the cooling air guide member (the jet duct) will be described with reference to FIG. 15. The abscissa axis represents the gap 101(A) between the fan-incorporating heatsink received in the CPU-cooling hole 8 and the cooling air guide member (the jet duct), and the ordinate axis represents (the device temperature of the CPU—the board intake-air temperature). FIG. 15 shows an example in which the first cooling fan is fixed. When A is 2 mm, (the device temperature—the board intake-air temperature) has a minimum value. The reasons for this are that as A increases, the amount of leakage of the cooling air through the gap 101(A) between the fan-incorporating heatsink received in the CPU-cooling hole 8 and the cooling air guide member (the jet duct) increases, and that the warm cooling air having flowed out of the second cooling fan again enters the second cooling fan. On the other hand, when A is smaller than 2 mm, and the cooling air guide member and the fan-incorporating heatsink are held in intimate contact with each other, the area of entry of the cooling air into the fan-incorporating heatsink is smaller. As a result, a pressure loss becomes large at an inlet portion of fins, and when the same fan is used, the flow rate of the supplied cooling air decreases. Therefore, when A was smaller than 2 mm, the value of the device temperature—the board intake-air temperature increased. The optimum value of the gap 101(A) between the fan-incorporating heatsink received in the CPU-cooling hole 8 and the cooling air guide member (the jet duct) is 1 to 3 mm.

Figure 16:
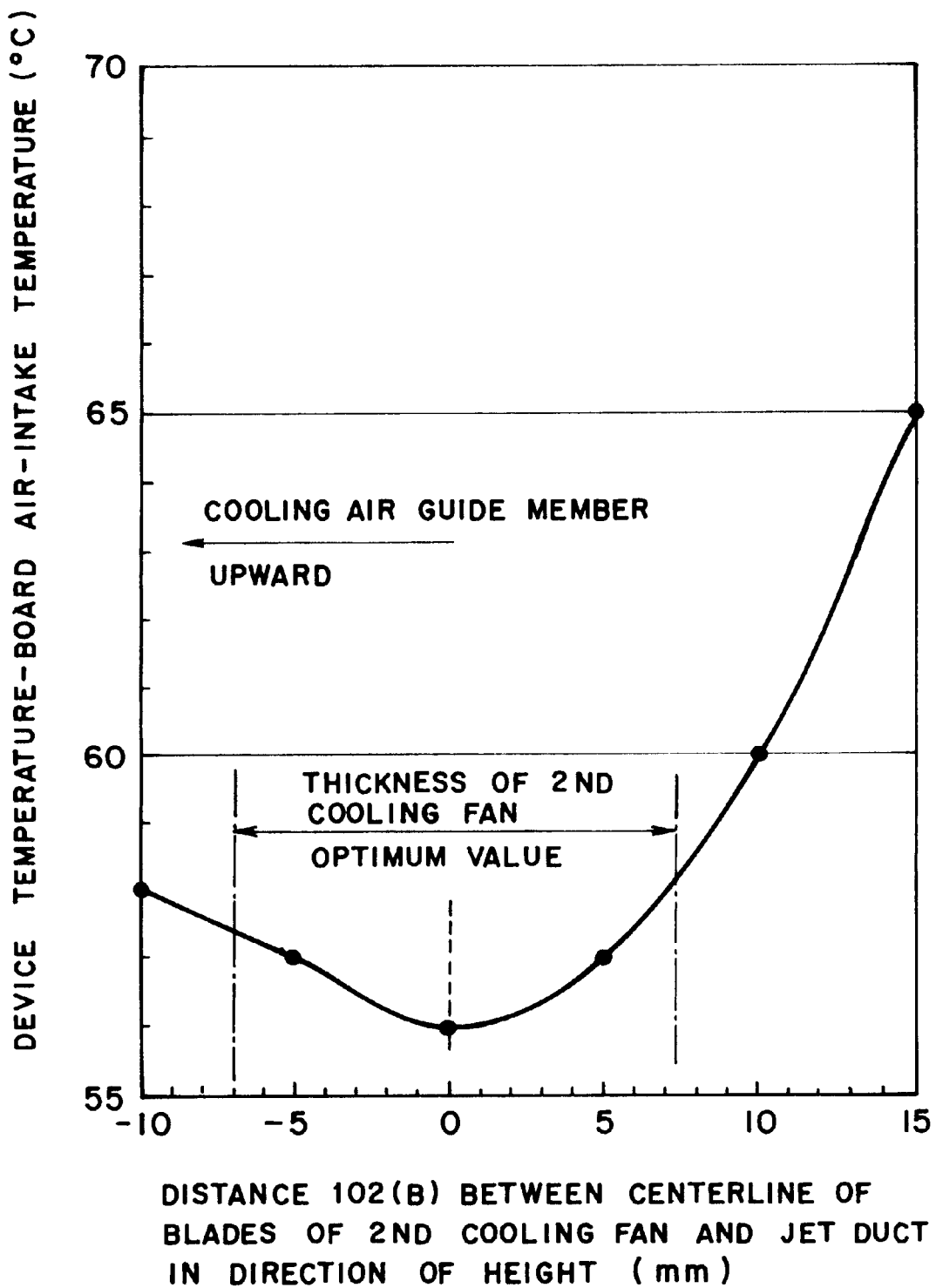
FIG. 16 is a graph showing the relation between the distance (deviation) B between the centerline of blades of a second cooling fan and the cooling air guide member (jet duct) in a direction of the height and the temperature difference.

Next, the optimum relative position with respect to the distance 102(B) between the centerline of the blades of the second cooling fan and the cooling air guide member (jet duct) in the direction of the height will be described with reference to FIG. 16. The ordinate axis represents the device temperature of the CPU—the board intake-air temperature as in FIG. 15. When B is 0 mm, the device temperature—the board intake-air temperature has a minimum value. The reason for this is that by separating the front and rear sides of the second cooling fan from each other, the warm cooling air having flowed out of the second cooling fan is prevented from again entering the second cooling fan. On the other hand, in the range exceeding the thickness of the second cooling fan, the intake port and discharge port of the second cooling fan can not be separated from each other, and a circulation of the cooling air develops around the second cooling fan, so that the value of the device temperature—the board intake-air temperature extremely increases. The optimum value of the distance 102(B) between the centerline of the blades of the second cooling fan and the cooling air guide member (jet duct) in the direction of the height is in the range corresponding to the thickness of the second cooling fan, as measured from the centerline of the blades of the second cooling fan.

Figure 17:
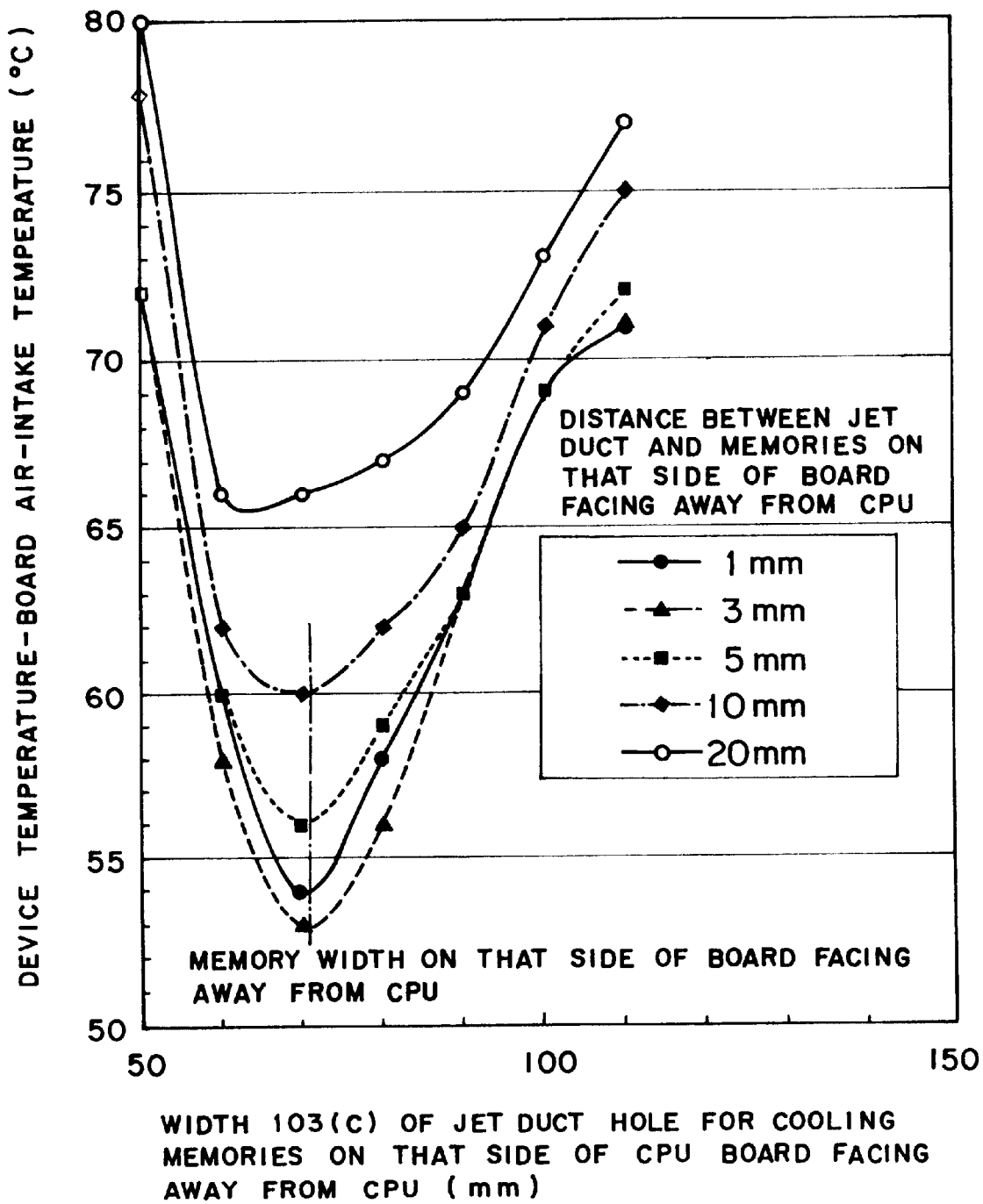
FIG. 17 is a graph showing a width C of a duct hole for cooling memories on that side of a CPU board, facing away from a CPU, and the temperature difference.

Next, the width 103(C) of the duct hole in the cooling air guide member for cooling the memories on that side of the CPU board facing away from the CPU will be described with reference to FIG. 17. The ordinate axis represents the device temperature of the memories—the board intake-air temperature. Parameters in FIG. 17 represent the distance between the cooling air guide member (the jet duct) and the memories mounted on that side of the CPU board facing away from the CPU. When this distance is as large as 20 mm, the cooling air having flowed out of the memory-cooling duct hole in the cooling air guide member spreads before it reaches the memories, and therefore when C is in the range smaller than the memory width, the device temperature—the board intake-air temperature has a minimum value. On the other hand, when the distance between the cooling air guide member (the jet duct) and the memories on that side of the CPU board facing away from the CPU is not more than 10 mm, the device temperature—the board intake-air temperature has a minimum value when C has the same length as the memory width. When the distance between the cooling air guide member (the jet duct) and the memories on that side of the CPU board facing away from the CPU is 1 mm, the minimum value of the device temperature—the board intake-air temperature is larger than that obtained when this distance is 3 mm, and the reason for this is that a pressure loss developing when the cooling air impinges on the memories increases. Therefore, when the first cooling fan is the same, the flow rate of the supplied cooling air decreases. If C is narrower than the memory width, the cooling air can not be supplied to the whole of the memories. If C is extremely wider than the memory width, the velocity of the cooling air supplied to the memories decreases, and also a waste of the cooling air increases, so that the device temperature—the board intake-air temperature increases. Therefore, in the narrow space, the optimum value of the width 103(C) of the duct hole in the cooling air guide member for cooling the memories on that side of the CPU board, facing away from the CPU, is the memory width.

Next, the optimum configuration for the distance (deviation) 104(D) between the centers of the memories on that side of the CPU board facing away from the CPU and the centerline (axis) of the memory-cooling jet duct hole is explained with reference to FIG. 18. In this example, the first cooling fan is disposed downstream of the CPU boards. As in FIG. 17, the ordinate axis represents the device temperature of the memories–the board intake-air temperature, and parameters represent the distance between the cooling air guide member (the jet duct) and the memories mounted on that side of the CPU board facing away from the CPU. In all cases, since the cooling air is drawn by the first cooling fan, the device temperature—the board intake-air temperature has a minimum value when the memory-cooling hole is disposed upstream of the memories. The distance (parameter) from the cooling air guide member to the memories is increased to 10 mm and 20 mm, the cooling air having flowed out of the memory-cooling hole in the cooling air guide member spreads before it reaches the memories, and therefore when the centerline of the memory-cooling hole is much shifted from the centers of the memories toward the upstream side, the device temperature—the board intake-air temperature has a minimum value. When the distance between the cooling air guide member (the jet duct) and the memories mounted on that side of the CPU board facing away from the CPU is 1 mm, the minimum value of the device temperature—the board intake-air temperature is larger than that obtained when this distance is 3 mm, and the reason for this is that a pressure loss developing when the cooling air impinges on the memories increases, as described above for FIG. 17. Therefore, when the first cooling fan is the same, the flow rate of the supplied cooling air decreases. If the centerline of the memory-cooling hole is shifted from the centers of the memories toward the downstream side, the cooling air is hardly supplied to the memories, and the cooling performance is almost the same as natural radiation. If the centerline of the memory-cooling hole is extremely shifted toward the upstream side, the supplied cooling air does not impinge on the memories, but is applied thereto in a direction generally parallel to the memories, so that the thermal conductivity is lowered and the device temperature—the board intake-air temperature increases. Therefore, with respect to the distance (deviation) 104(D), in the very small space, the centerline (axis) of the memory-cooling jet duct hole should be suitably deviated or spaced from the centers of the memories on that side of the CPU board facing away from the CPU toward the upstream side, and preferably should be spaced a distance 1 to 3 mm therefrom.

The present invention provides the above-mentioned constructions, and therefore the following effects are achieved.

The duct is provided on the board having the IC chips and the LSI package mounted thereon, the second cooling fan separate from the first cooling fan of the fan-incorporating heatsink is provided at one end of the duct so as to feed the cooling air toward the board, and the duct is so designed as to forcibly pass the cooling air through the first cooling fan in the direction of the axis thereof. With this construction, even if the first cooling fan of the fan-incorporating heatsink is stopped, the amount and flow of the cooling air, as obtained when the first cooling fan is driven, can be secured.

The cooling air is prevented from circulating around the fan-incorporating heatsink, and the cooling a-performance of the fan-incorporating heatsink as well as the reliability of the air-cooled electronic equipment apparatus having this heatsink mounted thereon is improved.

The device temperature of the LSI package and IC chips 3 can be prevented from abruptly rising, and therefore even if any of the plurality of LSI packages is stopped, it is not necessary to stop the supply of electric power to all of the devices on the board, but it is only necessary to stop the supply of electric power to the relevant device. Besides, before the device temperature reaches an upper limit of the allowable temperature range, data stored in the LSI package and the IC chips 3 can be stored in or transferred to other memory device.

A plurality of holes are provided in the planes of projection of the IC chips mounted on that side of the board facing away from the fan-incorporating heatsink, and a plurality of holes are provided in that portion of the duct disposed adjacent to the second cooling fan. With this construction fresh cooling air can be supplied to the IC chips through the holes formed in the duct, the temperature distribution between the IC chips can be made uniform, a waste of the cooling air can be eliminated, the cooling can be effected with a smaller amount of the cooling air, the noises of the computer are reduced, and the size of the computer can be reduced.

The duct comprises at least two parts, and one of these parts is provided at that side where the connector for transmitting and receiving signals relative to the board and for supply electric power is provided. With this construction the efficiency of attachment and detachment of the board is enhanced, the time required for the attaching and detaching operations can be reduced, and the reliability of the air-cooled electronic equipment apparatus is improved.

After the first cooling fan 18 is stopped, the CPU1 corresponding to this cooling fan 18 is prevented from being locally increased in temperature, and there can be secured the predetermined time sufficient to protect the necessary data before the shut-down of the system. Besides, after the data is protected, only the relevant CPU unit can be electrically interrupted, therefore the data necessary for re-activating the computer is not lost, and the reliability of the computer 33 can be improved to a maximum degree.

What is claimed is:

1. An air-cooled electronic equipment apparatus comprising a semiconductor device mounted on a board, said semiconductor device being a heat-generating device; a first cooling fan mounted on said semiconductor device so as to blow the air toward said semiconductor device and said board; a second cooling fan located on one side of said semiconductor device for supplying cooling air to said board; and a duct including a wall located on an opposite side of said semiconductor device from the second cooling fan for directing the cooling air, supplied by said second cooling fan, which has passed beyond the semiconductor device back toward said board through said first cooling fan.

2. An air-cooled electronic equipment apparatus comprising a plurality of semiconductor devices mounted on a board, each of said semiconductor devices being a heat-generating device; heat-radiating fin members mounted respectively on said semiconductor devices; first cooling fans mounted respectively on said fin members so as to blow the air toward said semiconductor devices and said board; a second cooling fan located on one side of said semiconductor devices for supplying cooling air to said board; and a duct including a wall located on an opposite side of said semiconductor device from the second cooling fan for directing the cooling air, supplied by said second cooling fan, which has passed beyond the semiconductor devices back toward said board.

3. Apparatus according to claim 1 or claim 2, further comprising partition means provided for said first cooling fan, and for dividing said cooling air flow passage into a first flow passage extending from said second cooling fan to said first cooling fan and a second flow passage extending from said first cooling fan to an end portion of said board.

4. Apparatus according to claim 3, in which said partition means for partitioning said cooling air flow passage is a duct which prevents an air stream, blown from said first cooling fan, from flowing into an inlet of said first cooling fan.

5. Apparatus according to claim 1 or claim 2, further comprising a flow passage provided so as to direct, the cooling air, supplied from said second cooling fan, toward that side of said board facing away from said first cooling fan.

6. Apparatus according to claim 1 or claim 2, wherein said cooling fan is provided downstream of said board.

7. An air-cooled electronic apparatus according to claim 1, wherein the cooling air which has passed beyond the semiconductor device and which is directed by the wall back toward said board through said first cooling fan is cooling air which has also initially passed over said first cooling fan.

8. An air-cooled electronic apparatus according to claim 2, wherein the cooling air which has passed beyond the semiconductor device and is directed back toward said board, is cooling air which is directed back toward said board through said first cooling fan and which has also initially passed over said first cooling fan.

9. An air-cooled electronic equipment apparatus comprising a board; a plurality of main semiconductor devices mounted on said board, each of said main semiconductor devices generating a large amount of heat; auxiliary semiconductor devices each generating a smaller amount of heat than each of said main semiconductor devices does; heat-radiating fin members mounted respectively on said main semiconductor devices; first cooling fans mounted respectively on said fin members so as to blow the air toward said main semiconductor devices and said board; a second cooling fan for supplying cooling air to said board; means for detecting of the number of revolutions of said first and second cooling fans; means for detecting abnormality of said fans in accordance with the detected fan revolution number; and means for determining an operation of said main semiconductor device in accordance with results of the detection of said abnormality detecting means.

10. Apparatus according to claim 9, in which said means for determining the operation of said main semiconductor device stops the main semiconductor device, corresponding to said fan with respect to which the abnormality has been detected by said abnormality detecting means, after a predetermined period of time.

11. An air-cooled electronic equipment apparatus comprising at least one board; a plurality of CPUs mounted on said board, each of said CPUs generating a large amount of heat; memories each generating a smaller amount of heat than each of said main semiconductor devices does; heat-radiating fin members mounted respectively on said CPUs; first cooling fans mounted respectively on said fin members so as to blow the air toward said CPUs and said board; a second cooling fan for supplying cooling air to said board; means for detecting of the number of revolutions of said first and second cooling fans; means for detecting abnormality of said fans in accordance with the detected fan revolution number; means for storing arithmetic data, retained in said CPU, in said memory or an external memory device in accordance with the detection results of said abnormality detecting means; and means for stopping only the operation of said CPU, having said data, after the storing of said data is finished.

12. Apparatus according to claim 11, in which said memories are connected to said plurality of CPUs, and data can be read and written between said memory and said CPU.

13. An air-cooled electronic equipment apparatus comprising a semiconductor device mounted on a board, a first fan for blowing air against the semiconductor device and the board, a second fan located on one side of said semiconductor device for supplying cooling air to said semiconductor device, a duct in communication with said second fan, a hole provided in said duct, said semiconductor device mounted on said board being arranged in a position facing said hole, and a heatsink for said semiconductor device being provided at least partially in an interior of said duct and covering said first fan, wherein said duct includes a wall located on an opposite side of said semiconductor device from said second fan so that cooling air in said duct which has passed beyond said semiconductor device is directed back toward said board.

14. An air-cooled electronic apparatus according to claim 13, wherein the cooling air which has passed beyond the semiconductor device and is directed back toward said board, is cooling air which is directed back toward said board through said first fan and which has also initially passed over said first fan.

* * * * *